(12) United States Patent
Wylie et al.

(10) Patent No.: US 8,071,930 B2
(45) Date of Patent: Dec. 6, 2011

(54) SOLAR COLLECTOR HAVING A SPACED FRAME SUPPORT STRUCTURE WITH A MULTIPLICITY OF LINEAR STRUTS

(75) Inventors: Cameron G. Wylie, San Mateo, CA (US); Tamir Lance, Los Gatos, CA (US); Brian J. Ignaut, San Mateo, CA (US); Marc A. Finot, Palo Alto, CA (US); Mang V. Chau, San Jose, CA (US)

(73) Assignee: SkylineSolar, Inc., Mountain View, CA (US)

( * ) Notice: Subject to any disclaimer, the term of this patent is extended or adjusted under 35 U.S.C. 154(b) by 0 days.

(21) Appl. No.: 12/982,703

(22) Filed: Dec. 30, 2010

(65) Prior Publication Data

US 2011/0108091 A1    May 12, 2011

Related U.S. Application Data

(60) Provisional application No. 61/362,591, filed on Jul. 8, 2010.

(51) Int. Cl.
*G01C 21/02* (2006.01)
(52) U.S. Cl. .................................. 250/203.4; 250/239
(58) Field of Classification Search ............... 250/203.4, 250/203.6, 216, 221; 136/244–259; 126/575–607
See application file for complete search history.

(56) References Cited

U.S. PATENT DOCUMENTS

| | | | |
|---|---|---|---|
| 4,296,737 A | 10/1981 | Silk | |
| 4,454,371 A | 6/1984 | Folino | |
| 4,538,886 A | 9/1985 | Townsend et al. | |
| 4,571,812 A | 2/1986 | Gee | |
| 6,276,359 B1 | 8/2001 | Frazier | |
| 6,971,756 B2 * | 12/2005 | Vasylyev et al. | 359/852 |
| 7,530,201 B2 | 5/2009 | Reynolds et al. | |
| 7,578,109 B2 | 8/2009 | Reynolds et al. | |
| 7,587,862 B2 | 9/2009 | Reynolds et al. | |
| 7,709,730 B2 | 5/2010 | Johnson et al. | |

(Continued)

FOREIGN PATENT DOCUMENTS

EP    1903155    3/2008

(Continued)

OTHER PUBLICATIONS

Whitefield et al. "The Development and Testing of Small Concetrating PV Systems." Solar Energy, Pergamon Press. Oxford, GB, vol. 67, No. 1-3, pp. 23-34, Jul. 1, 1999.
HelioDynamics, "Harmony 11.5 kW Solar Cogeneration," Product datasheet, 2 pages.

(Continued)

*Primary Examiner* — Que T Le
(74) *Attorney, Agent, or Firm* — Beyer Law Group LLP

(57) ABSTRACT

The present invention relates to a solar energy collector suitable for use in a solar energy collection system. The solar energy collection system includes the collector, a stand that supports the collector and a tracking system that causes the collector to track movements of the sun along at least one axis. The collector includes one or more reflector panels, one or more solar receivers, and a support structure that physically supports the reflector panels and solar receivers. Some designs involve a reflector panel that has a compound curvature. That is, the reflector panel has a convex shape along one direction and a concave shape in another direction. In another aspect of the invention, the collector includes a space frame support structure.

20 Claims, 16 Drawing Sheets

U.S. PATENT DOCUMENTS

| | | |
|---|---|---|
| 7,820,906 B2 | 10/2010 | Johnson et al. |
| 2006/0053726 A1 | 3/2006 | Reynolds et al. |
| 2008/0223429 A1 | 9/2008 | Everett et al. |
| 2008/0276929 A1 | 11/2008 | Gerwing et al. |
| 2009/0095283 A1 | 4/2009 | Curtis et al. |
| 2009/0101195 A1 | 4/2009 | Reynolds et al. |
| 2010/0154788 A1 | 6/2010 | Wells et al. |
| 2010/0163014 A1 | 7/2010 | Johnson et al. |
| 2010/0218807 A1 | 9/2010 | Arbore et al. |

FOREIGN PATENT DOCUMENTS

| | | |
|---|---|---|
| WO | WO 2005/090873 | 9/2005 |

OTHER PUBLICATIONS

Erik Rossen, "My visit to EUCLIDES," http://www.rossen.ch/solar/euclides.html, downloaded on Jan. 19, 2011, 4 pages.

U.S. Appl. No. 12/982,701, filed Dec. 30, 2010.

U.S. Appl. No. 61/362,591, filed Jul. 8, 2010.

U.S. Appl. No. 12/846,620, filed Jul. 29, 2010.

Weatherby C. K. and Bentley R. W., "Further development and field test results of two low-material-cost parabolic-trough concentrators," Proceedings of the $2^{nd}$ World Conference on PV Solar Energy Conversion, Vienna, Jul. 6-10, 1998, pp. 2189-2192.

Office Action dated May 9, 2010 from U.S. Appl. No. 12/982,701.

\* cited by examiner

SOLAR COLLECTOR HAVING A SPACED FRAME SUPPORT STRUCTURE WITH A MULTIPLICITY OF LINEAR STRUTS

CROSS-REFERENCE TO RELATED APPLICATION(S)

The present invention claims priority to U.S. Provisional Application No. 61/362,591, entitled "Optimized Solar Collector," filed Jul. 8, 2010, which is incorporated herein in its entirety for all purposes.

FIELD OF THE INVENTION

The present invention relates to solar technologies. More specifically, the present invention relates to various collector, reflector and support structure designs for use in concentrating photovoltaic systems.

BACKGROUND OF THE INVENTION

Typically, the most expensive component of a photovoltaic (PV) solar collection system is the photovoltaic cell. To help conserve photovoltaic material, concentrating photovoltaic (CPV) systems use minors or lenses to concentrate solar radiation on a smaller cell area. Since the material used to make the optical concentrator is less expensive than the material used to make the cells, CPV systems are thought to be more cost-effective than conventional PV systems.

One of the design challenges for any CPV system is the need to balance multiple priorities. For one, a CPV system requires a support structure that arranges the optical concentrators and the photovoltaic cells such that incoming sunlight is efficiently converted into electricity. This support structure should also accommodate a tracking system and provide for the adequate dissipation of heat. Another consideration is the cost of manufacturing, installing and repairing the CPV system. Existing CPV designs address these issues in a wide variety of ways. Although existing CPV systems work well, there are continuing efforts to improve the performance, efficiency and reliability of CPV systems.

SUMMARY OF THE INVENTION

One aspect of the present invention relates to a photovoltaic solar energy collector suitable for use in a solar energy collection system that includes a stand and a tracking system. The solar collector includes one or more reflector panels, one or more solar receivers, and a support structure. In this aspect of the present invention, the reflective panel has a compound curvature. That is, the reflective panel has a concave shape in one direction that is suitable for directing incident light to form a flux line on the solar receivers. The reflective panel also has a slightly convex shape in another direction. This compound curvature offers various advantages. For example, gaps may form in or between the reflector panels that can cause the flux line on the solar receivers to be non-continuous. This can reduce the efficiency of the photovoltaic cells. The convex curvature, by spreading out the light reflected by each reflector panel, can help wash out such gaps and maintain the continuity of the flux line making the flux line more longitudinally uniform As a result, the photovoltaic cells on the collector receive more uniform exposure to reflected sunlight.

The present invention contemplates a large assortment of collector designs. Some embodiments involve an A-type design, where the reflective panels curve inward towards one another and reflect light outward to solar receivers that are positioned at the periphery of the collector. Still other embodiments involve a U-type design, where the reflective panels curve outward away from one another and reflect light inward to solar receivers that are positioned over a central region between the two reflective panels. Some designs involve extended versions of either of these designs, in which a larger number of reflector panels are mounted onto a common base platform and solar receivers are positioned on the backsides of the reflector panels. The present invention also contemplates a power generation plant where solar collector rows are formed from multiple collectors that are longitudinally attached and arranged to pivot in tandem to track movements of the sun.

In another aspect of the invention, the support structure for the solar collector is a space frame. That is, the support structure is formed from interlocking linear struts that are connected at nodes. There are large apertures and spaces between the struts that allow the free flow of air through the space frame, thereby reducing the wind load on the solar collector. The space frame support structure includes receiver support struts and reflector support struts. In various implementations, the receiver and reflector support struts are integrated into a unitary space frame support structure. That is, struts and nodes are arranged such that the loads from the reflectors and receivers are not carried entirely by the struts that are immediately attached to them. In various preferred embodiments, these loads are instead dispersed more widely through the space frame support structure.

There are a wide variety of ways of arranging the struts and nodes of the space frame support structure. Some implementations involve the use of longerons that extend parallel to one another along the longitudinal axis of the solar collector. Nodes are positioned at various points along each longeron. Multiple struts extend diagonally outward from these nodes to provide additional structural support for the solar collector. In some embodiments, there is a upper longeron that extends down the middle of the collector. Solar receivers may be attached at various points along the upper longeron. In various other embodiments, solar receivers are instead attached with side longerons that are located at the periphery of the collector. Preferably, the space frame support structure is arranged to be highly flexible. That is, rather than being tailored to reflector panels and/or solar receivers of particular shapes and sizes, the space frame support structure is arranged to accommodate various types of reflector panels and solar receivers such that minimal additional work is required to attach them to the space frame support structure

BRIEF DESCRIPTION OF THE DRAWINGS

The invention and the advantages thereof, may best be understood by reference to the following description taken in conjunction with the accompanying drawings in which.

In the drawings, like reference numerals are sometimes used to designate like structural elements. It should also be appreciated that the depictions in the figures are diagrammatic and not to scale.

DETAILED DESCRIPTION OF THE PREFERRED EMBODIMENTS

Figure 1A:
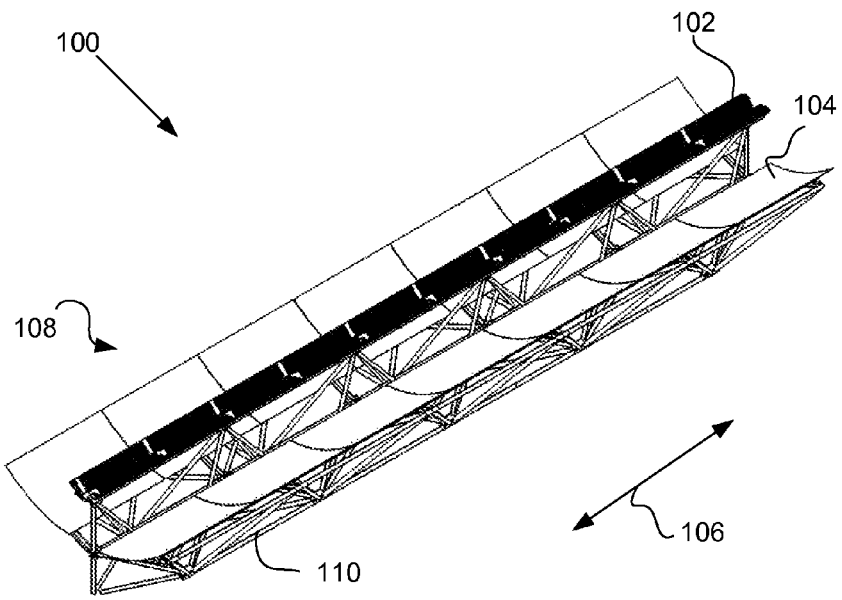
FIGS. 1A and 1B are diagrammatic perspective and cross-sectional views of a solar collector according to a particular embodiment of the present invention.

The present invention relates generally to concentrating photovoltaic systems. The assignee for the present application, Skyline Solar, Inc., has received multiple patents related to such technologies, such as U.S. Pat. No. 7,709,730, entitled "Dual Trough Concentrating Solar Photovoltaic Module," filed Apr. 10, 2008, which is hereby incorporated by reference in its entirety for all purposes and is hereinafter referred to as the '730 patent.

The '730 patent describes various solar collector designs that involve a trough-shaped reflector that directs incident sunlight to a string of photovoltaic cells. The described designs work well for many applications. During the course of installing, manufacturing and operating solar energy collection systems, however, the assignee has identified various areas in which the designs could be further improved. For example, ordinary wear and tear can form gaps in the reflector. This can skew the reflection of light by the reflector and may reduce the collection of solar energy. It would also be desirable to develop an improved support structure for the collector that is resilient, lightweight and cost-effective. The present application contemplates a wide variety of design concepts relating to collectors, support structures, reflector panels, power plants and tracking systems that address these and other concerns.

Initially, with reference to FIGS. 1A and 1B, a concentrating photovoltaic solar collector 100 according to a particular embodiment of the present invention will be described. The solar collector includes multiple solar receivers 102 and reflector panels 104 that each have a compound curvature. The reflector panels 104 are arranged in one or more rows that extend along the longitudinal axis 106. Each row includes multiple, adjacent reflector panels that cooperate to form a reflector 108 with a substantially continuous reflective surface. The solar receivers 102 each have at least one photovoltaic cell 118 and are arranged to form a string of photovoltaic cells 118. A space frame support structure 110 physically supports the reflector panels 104 and the solar receivers 102. A tracking system causes the collector to pivot to track the movements of the sun. FIG. 1B is a diagrammatic cross-sectional view of the solar collector 100 illustrated in FIG. 1A.

Foundation settling, differential thermal expansion, and mechanical tolerances in the manufacturing and installation of a reflector can cause undesirable gaps to open up between the reflector panels 104 in the reflector. If the reflective surface becomes non-continuous, then the flux line that forms on the string of photovoltaic cells 118 may include gaps and become non-continuous as well. As a result, the exposure of the photovoltaic cells to concentrated sunlight will be less uniform, which can substantially reduce the cell strings' efficiency.

Various embodiments of the present invention relate to reflector panels 104 that are designed to address this problem. More specifically, each reflector panel 104 incorporates two different curvatures along two different axes. Along a plane defined by an x axis 114 and a y axis 112, the reflector panel 104 has a concave shape. Along another axis (e.g., the longitudinal axis 106, which goes into the page in FIG. 1B and is perpendicular to the x-y plane), the reflector panel has a convex shape. The concave shape is arranged to direct incident light 116 to the solar receivers 102, as shown by the arrows in FIG. 1B. The convex shape causes the light that is reflected by the panel 104 to be reflected in a wider arc along the longitudinal axis 106. That is, the convex shape of each panel 104 forms a wider flux line (as measured along the longitudinal axis 106) than would be the case if the panel were flat along the longitudinal axis. As a result, gaps in the flux line that are formed by gaps in the reflective surface are covered up or washed away. This can produce a more continuous, uniform flux line, which contributes to greater cell string efficiency.

Figure 1B:
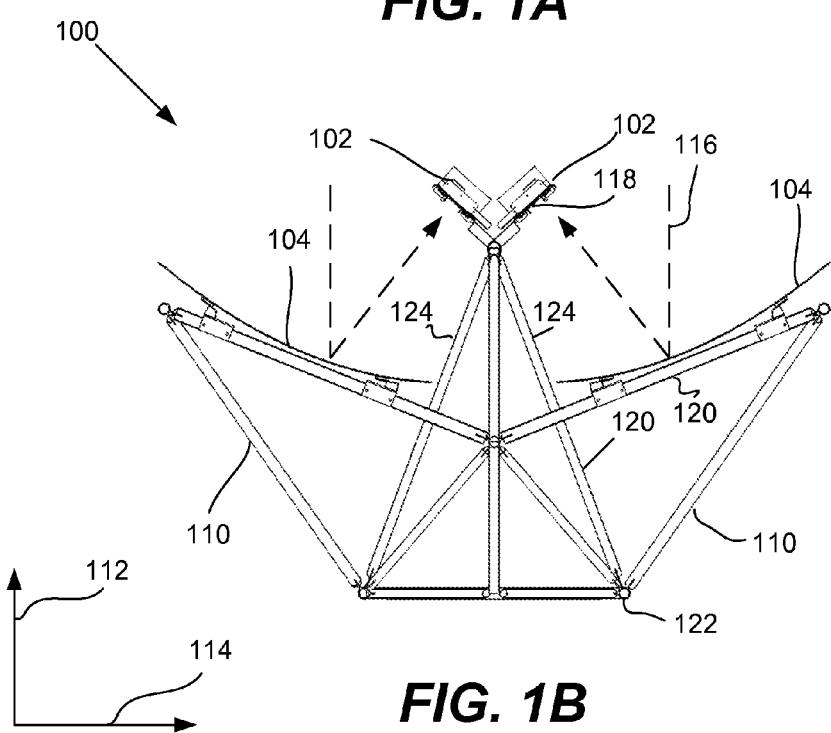

Another notable feature of the collector 100 illustrated in FIGS. 1A and 1B is the space frame support structure 110 that supports the solar receivers and reflector panels. The space frame support structure includes multiple linear struts 120 that are connected with nodes 122 to form repeating geometric shapes (e.g., triangles, pyramids, tetrahedrons, etc.) This arrangement offers various advantages. For one, the large apertures in between the struts 120 allow the free flow of air and reduce wind load on the collector. The use of repeating components, such as the nodes 122 and the struts 120, can streamline the manufacturing, installation and repair of the space frame. The longitudinal period of the repeating geometric pattern does not have to correspond to the longitudinal length of either a receiver or reflector panel, allowing flexibility in receiver and reflector panel design.

Additionally, the space frame support structure 110 in FIGS. 1A and 1B is designed to operate as a unitary structure. That is, struts that support different components of the collector are interlocked with the rest of the space frame and are therefore more stable and resistant to stress and bending. In the illustrated embodiment, for example, the support for the solar receivers is not a single, isolated column or pedestal.

Instead, it is arranged in the form of multiple receiver support struts 124 that are connected to nodes 122 that in turn connect with and help support other struts and components, such as the reflector panels 104. The struts are arranged to firmly anchor important components of the collector within the support structure, reduce or eliminate bending, and form multiple paths through which mechanical loads may be dispersed.

The struts 120/124 and nodes 122 of the space frame structure may take a variety of forms. By way of example, the struts 120/124 may be cylinders, tubes, pipes, roll formed steel sections, hot rolled steel sections, etc. Many of the struts may have similar circumferences and may be formed using the same or similar manufacturing processes. The struts 120/124 may be connected with one another at the nodes 122 in any suitable manner, including the use of welding, metal clinching, adhesive, rivets, bolts and nuts, fasteners, etc. In some embodiments, the nodes 122 include connectors that are formed from extruded aluminum, sheet metal, forged steel spheres or other materials.

Preferably, the space frame support structure is designed to be compatible with many different types of reflector panels and solar receivers. In the illustrated embodiment, for example, the struts 120 underneath the reflector panels 104 form a stable base platform for physically supporting the reflector panels. This base platform is not arranged to be compatible only with a reflector panel of a highly specific length and curvature. That is, the base platform is not necessarily form fitted to the dimensions of a particular reflector panel. Instead, with minimal modifications (e.g., the drilling of holes, the securing of fasteners, etc.), the base platform can be configured to accommodate reflector panels of varying lengths, shapes and/or curvatures as long as the reflector panels, when lined up along the length of the collector, generally fit the dimensions of the space frame support structure.

The reflector panels 104 and solar receivers 102 may be arranged in a wide variety of ways, depending on the needs of a particular application. In the illustrated embodiment, for example, the reflector panels 104 form a U-like shape. The solar receivers 102 are arranged in two adjacent rows that are positioned higher and over a region that is between the reflectors. The two rows of solar receivers 102 support strings of photovoltaic cells 118 that face away from one another and towards the reflectors 104. When sunlight is incident on one of the longitudinally extended reflectors 104, a longitudinally extended flux line is formed on the corresponding string of photovoltaic cells 118. In another embodiment, the solar receivers 102 are positioned at the periphery of the collector 100, and the reflector panels 104, rather than directing incident light inward towards the center of the collector 100, instead direct light outward towards the periphery of the collector 100.

The reflector panels 104 may be made from any suitable reflective material. For example, metalized glass and aluminum work well as materials for the reflector panels 104. Each solar receiver 102 may include or be attached with a wide variety of components, such as a heat sink, fins, base plates, etc. In some embodiments, the heat sink and/or the solar receiver include a fluid conduit. The sunlight that is reflected onto the solar receivers 102 may be used to heat a liquid that is flowing through the fluid conduit. A wide variety of possible solar receiver, heat sink and fin designs are described in U.S. Pat. No. 7,820,906, entitled "Photovoltaic Receiver", filed May 20, 2008, and U.S. patent application Ser. No. 12/340,379, entitled "Solar Receiver," filed Dec. 19, 2008, which are hereby incorporated in their entirety for all purposes.

Figure 2A:
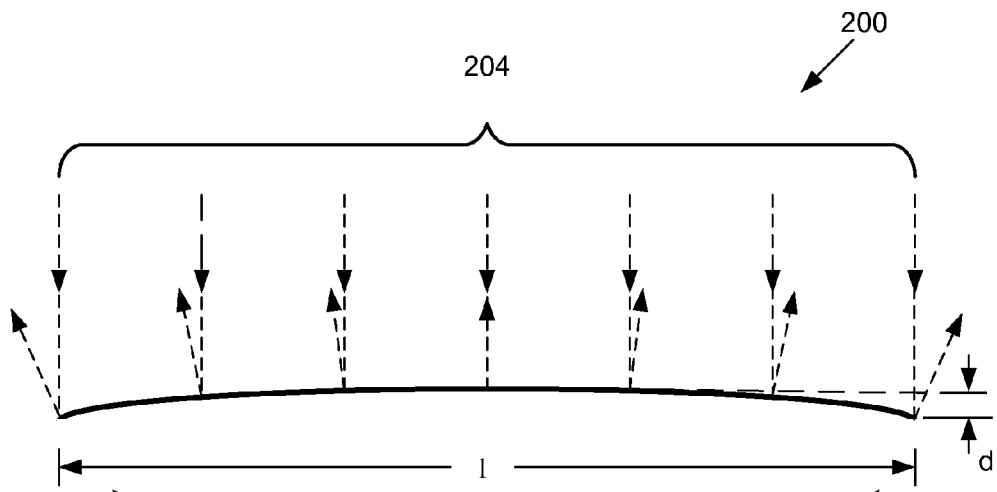
FIG. 2A is a diagrammatic side view of a reflector panel with a convex shape according to a particular embodiment of the present invention.
Figure 2B:
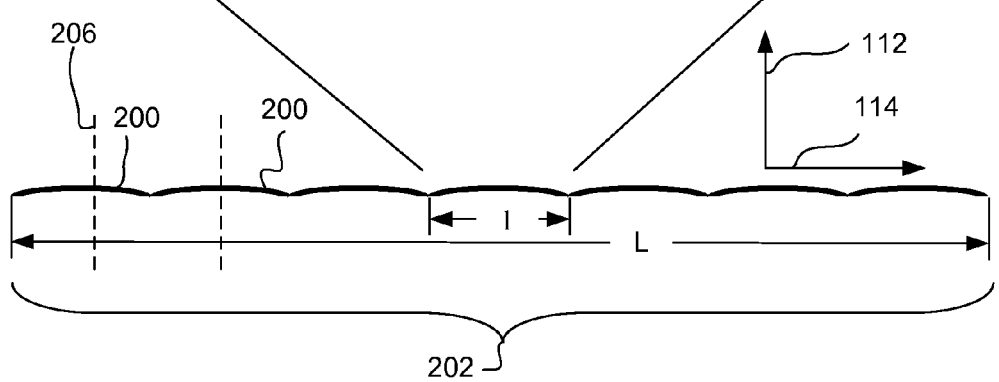
FIG. 2B is a diagrammatic side view of a reflector made of multiple reflector panels according to a particular embodiment of the present invention.
Figure 2C:
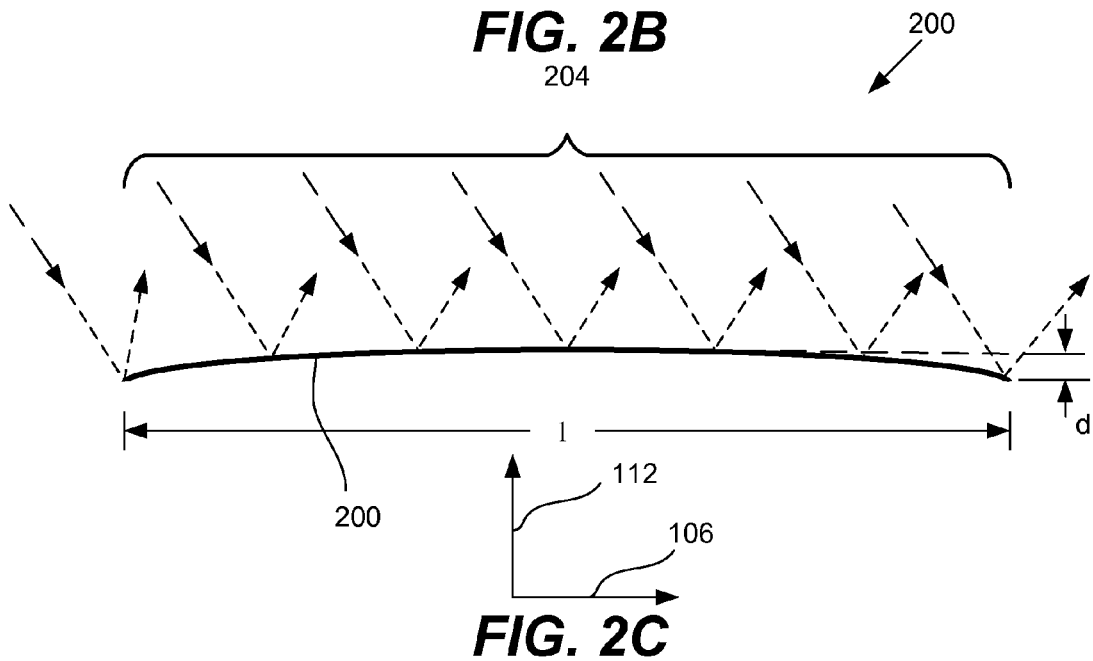
FIG. 2C is a diagrammatic side view of the reflector panel illustrated in FIG. 2A.

Referring next to FIGS. 2A and 2C, a reflector panel 200 with a compound curvature according to a particular embodiment of the present invention will be described. The reflector panel has a convex shape in one direction and a concave shape in another. FIGS. 2A and 2C are diagrammatic side views of the reflector panel 200 that show its convex shape. The convex shape is defined in part by a distance d, which measures the amount of maximum displacement of the convex shape relative to a flat reference surface, and a longitudinal length l. While the reflector panel in FIGS. 2A and 2C is shown as having a single convex bow, the reflector panel may also include multiple convex regions. In some embodiments, these convex regions may be interspersed with concave and/or flat regions. When properly utilized in a suitable collector, the convex shape of the reflector panel 200 may substantially improve the efficiency and performance of the collector.

As discussed earlier in connection with FIG. 1A, the present invention contemplates collector designs where multiple reflector panels 200 are arranged together along a longitudinal axis 106 to form a reflector 202 with a curved reflective surface. The reflective surface receives incident sunlight and directs it to a string of one or more photovoltaic cells. As a result, a flux line (e.g., a strip or band of concentrated illumination formed by the reflected light) is formed on the string of cells. The shape and dimensions of the flux line are defined in large measure by the shape of the reflector panel 200.

When the reflector panels are flat along the longitudinal axis, the flux line will tend to mirror the continuity of the reflective surface. That is, if the reflective surface is continuous, then the flux line tends to be continuous. However, if the reflective surface has gaps, then the flux line will also tend to have gaps (e.g., portions of the cell face within the periphery of the flux line that do not receive light from the reflective surface.)

Since the movement of the sun throughout the day causes light to be reflected by the reflector panels at a variety of angles, the effect of any gap between the reflector panels may appear almost anywhere along the length of the cell string. That is, a gap between two reflector panels could prevent a central portion of one of the photovoltaic cells from being illuminated by reflected light. This can substantially reduce cell efficiency, particularly when the cells are electrically connected in series. Unfortunately, it is not uncommon for gaps to develop between the reflective panels that make up the reflective surface. The gaps may arise due to errors in manufacturing, installation, operation or constant thermal expansion and contraction.

The convex shape of the reflector panels 200 helps to eliminate gaps in the flux line. FIGS. 2A and 2C illustrate how incoming sunlight 204 is reflected when it strikes the convex curvature of the reflector panel 200. The reflected light tends to spread or fan out from the reflector panel 200. Depending on the direction of the incoming sunlight, the reflected light may spread out on both sides of the reflector panel (e.g., as in FIG. 2A, where the incoming light is perpendicular to the longitudinal axis 106) or more to one side (e.g., as in FIG. 2C, where the incoming light is coming in at an angle.) Generally, the reflected light forms a wider flux line (along the longitudinal axis) then would be the case if the reflector panel 200 were flat.

Referring next to FIG. 2B, a reflector 202 made of the reflective panels 200 illustrated in FIGS. 2A and 2C will be described. The reflective panels 200 are arranged adjacent to one another along a longitudinal axis 106. Collectively, the reflective panels 200, each with length l, form a reflector 202 with a length L. The reflector includes multiple convex shapes, where each reflective panel 200 forms one of the concave shapes. When multiple reflector panels are arranged together in this manner, the aforementioned spreading out of the reflected light washes out or eliminates gaps in the flux line that would be normally be caused by gaps between the reflector panels. As a result of the washing out effect, the flux line on the photovoltaic cells is more continuous and uniform.

Various designs involve a reflector 202 where at least two or more adjacent reflector panels 200 of the reflector 202 have the same concave shape (e.g., as seen in FIG. 2B.) In some embodiments, the convex shape of each reflector panel 200 is also substantially symmetrical and the axes of symmetry 206 of the convex shapes of the reflector panels 200 run substantially parallel to one another. This arrangement promotes the spreading of light on both sides of each reflector panel 200, which can be particularly effective in washing out the effects of gaps between the reflector panels 200.

It should also be appreciated that the amount of convex curvature in each reflector panel 200 of a reflector 202 need not be the same. By way of example, the end reflector panels 200 shown in FIG. 2B may have a greater amount of convex curvature than the other reflector panels, since there may be a larger gap between these reflector panels and reflector panels on a longitudinally adjacent solar collector than the gap between adjacent reflector panels on the same solar collector.

The convex curvature of the reflector panel 200 may be different near the lower edge of a reflector panel 200 (e.g., the displacement d may be greater or lower) than it is near the upper edge of the reflector panel 200. The variation in convex curvature may be inversely related to the distance variation between the reflector panel and receiver. In particular the lower edge of the reflector panel may be closer to the receiver than the upper edge of the reflector panel. The convex curvature may thus be larger near the lower edge of the reflector panel and smaller near the upper edge of the reflector panel. This variation in convex curvature across the reflector panel may result in a longitudinally more uniform flux line.

It should be noted that in the figures, the degree of convex curvature is exaggerated for the purpose of clarity. Generally, the concavity of the reflector panel 200 is significantly greater than the convexity of the reflector panel (e.g., the concave radius of curvature may be 20 or more times less than the convex radius of curvature.) Note that a smaller radius of curvature corresponds to more curvature or a higher degree of concavity or convexity. Various embodiments involve a reflector panel with a convex radius of curvature for the reflector panel 200 that is approximately between 50 and 70 m, although the degree of curvature may be lower or higher for other implementations. In particular reflector panels 200 having a longer length in the longitudinal direction may generally have a larger convex radius of curvature.

Figure 3A:
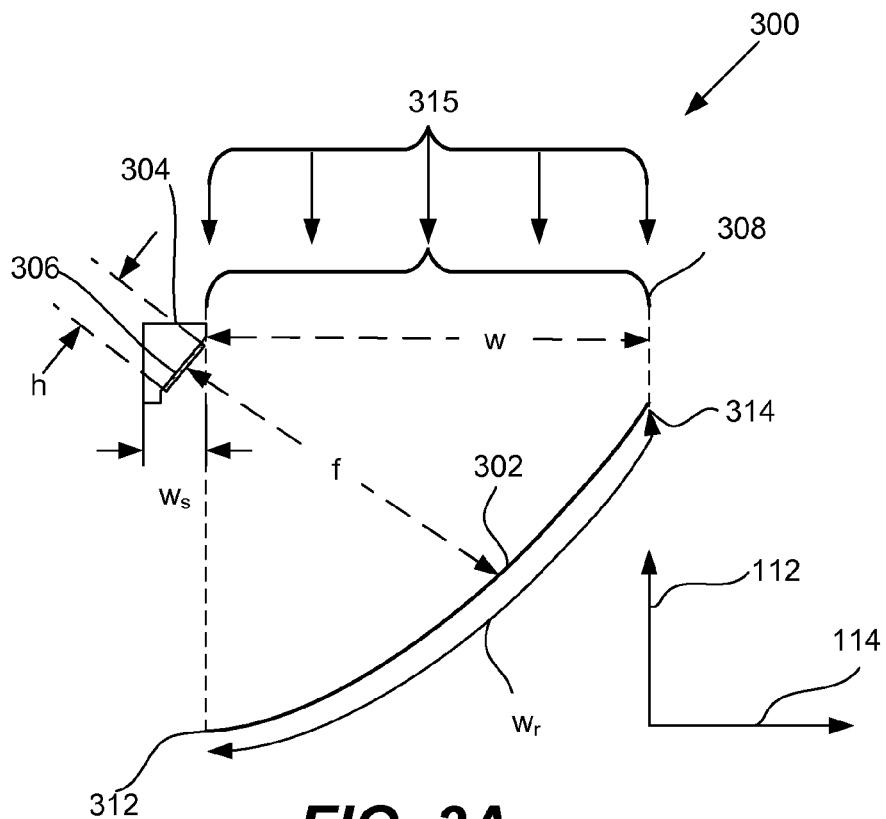
FIGS. 3A-3D are diagrammatic cross-sectional views of solar receivers and reflector panels according to various embodiments of the present invention.

Referring next to FIGS. 3A-3D, solar receiver and reflector arrangements according to various embodiments of the present invention will be described. FIG. 3A is a diagrammatic cross-sectional view of an arrangement 300 including a reflector panel 302 and a solar receiver 304. From this vantage point, the reflector panel 302 has a concave shape. The solar receiver includes one or more photovoltaic cells 306. The reflector panel 302, whose optical aperture has a width w, is arranged to direct incident sunlight to the solar receiver.

This arrangement 300 offers various advantages. For one, the solar receiver is positioned outside of the optical aperture 308 of the reflector panel 302. In the illustrated embodiment, for example, the solar receiver 304 (and any associated support structure) does not directly overlie the reflector panel 302 and does not shade the reflector panel 302 during the normal operation of the solar collector. This lack of shadowing helps maximize the energy output of the photovoltaic cells 306 by increasing the amount of light that is reflected to the cells.

Also, the arrangement 300 allows the reflector panel 302 to be positioned relatively close to the solar receiver 304. If the reflected light has to traverse a shorter distance between the reflector and the solar receiver, less precision is required from the collector and the tracking system. By way of example, assume that $f_{avg}$ is the average distance between all the points on the surface of the reflector panel 302 and the photovoltaic cell 306. Various collector designs arrange the solar receiver 304 and the reflector panel 302 such that $f_{avg}$ is approximately between 0.5 m and 1.5 m, although larger or smaller values of $f_{avg}$ may be used.

The size and shape of the reflector panel 302 may be adjusted so that light is concentrated on the photovoltaic cell 306 to the desired degree. The optical concentration factor, which may be defined as the ratio of the width $w_r$ of the reflector panel 302 to the height of the photovoltaic cell h, relates to the average increase in the sunlight intensity as compared to the intensity of the incoming sunlight 315. Since the photovoltaic cell 306 is typically the most expensive component of a collector, if a larger reflective surface can be used to focus light on a smaller photovoltaic area, there may be substantial cost savings. In various embodiments of the present invention, the reflector panels and solar receivers of the collector are arranged to have an optical concentration factor of approximately between 5 and 50.

The efficiency of the solar collector may also be improved by controlling the width $w_s$ of the solar receiver. If the receiver width $w_s$ along the x axis is reduced relative to the width w of the optical aperture, a greater proportion of the total collector area can be taken up by the reflectors, which in turn results in the direction of more light to the photovoltaic cells of the collector. Some implementations of the present invention contemplate a receiver width that is less than approximately 10%, 15% or 20% of the optical aperture width w.

Figure 3B:
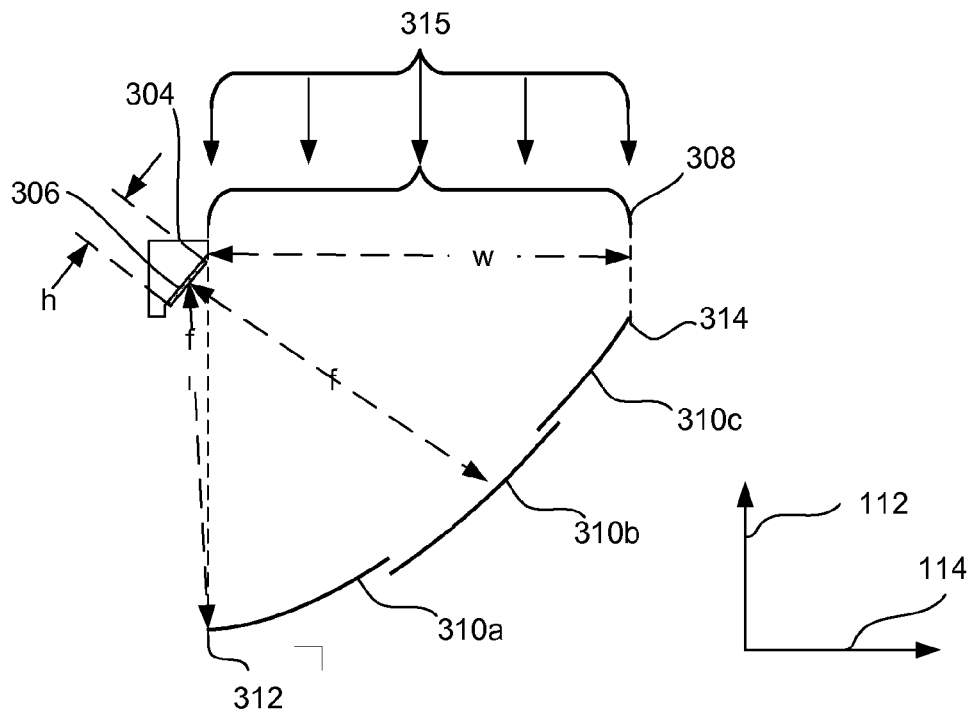

Referring next to FIG. 3B, a variation on the solar receiver and reflector arrangement of FIG. 3A according to another embodiment of the present invention will be described. The concave reflective surface of FIG. 3A, instead of being formed by a single reflector panel, is instead formed by multiple reflector panels 310a/310b/310c that are arranged side by side. That is, the reflector panels 310a/310b/310c form strips that extend substantially parallel to one another down the longitudinal length of the collector. For some applications, it is more cost-effective to manufacture a larger amount of smaller reflector panels as opposed to a smaller amount of larger ones.

Although three separate reflector panels are shown, it should be appreciated that the concave reflective surface may be formed from almost any number of reflector panels. The reflector panels may be attached in any suitable manner. In the illustrated embodiment, for example, the edges of the reflector panels 310a/310b/310c overlap one another and can be secured together using any suitable means, such as a fastener, a bolt, an adhesive, a latch, welding, etc. Various implementations involve multiple reflective panels that are each curved such that they cooperate to form a single reflective surface with a concave and/or parabolic shape. In other embodiments, each reflective panel 310a/310b/310c is substantially flat in the x-y plane, but are angled such that they collectively approximate a single concave or parabolic curve. They may have a slight convex curvature along the longitudinal axis.

Figure 3C:
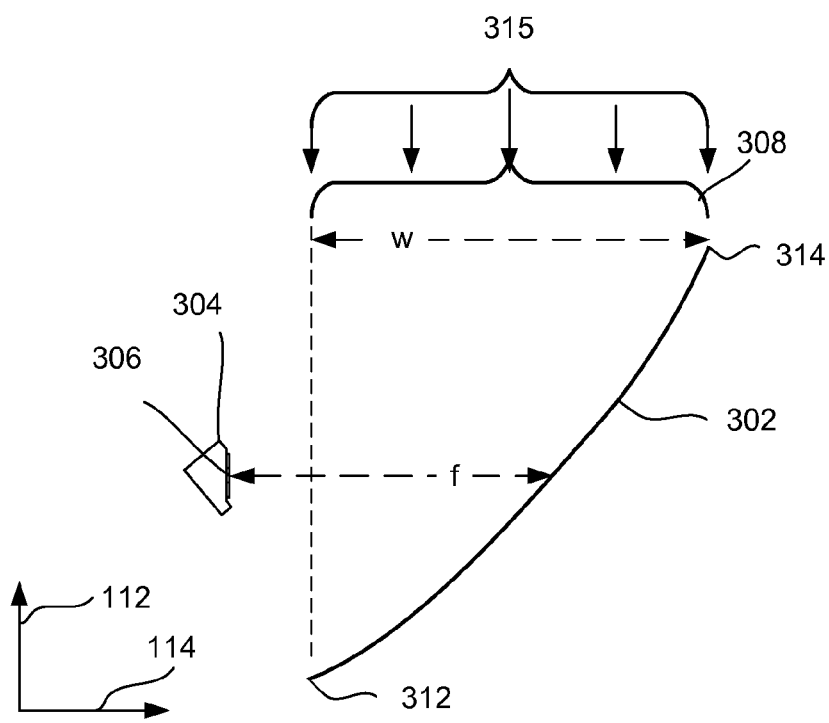
Figure 3D:
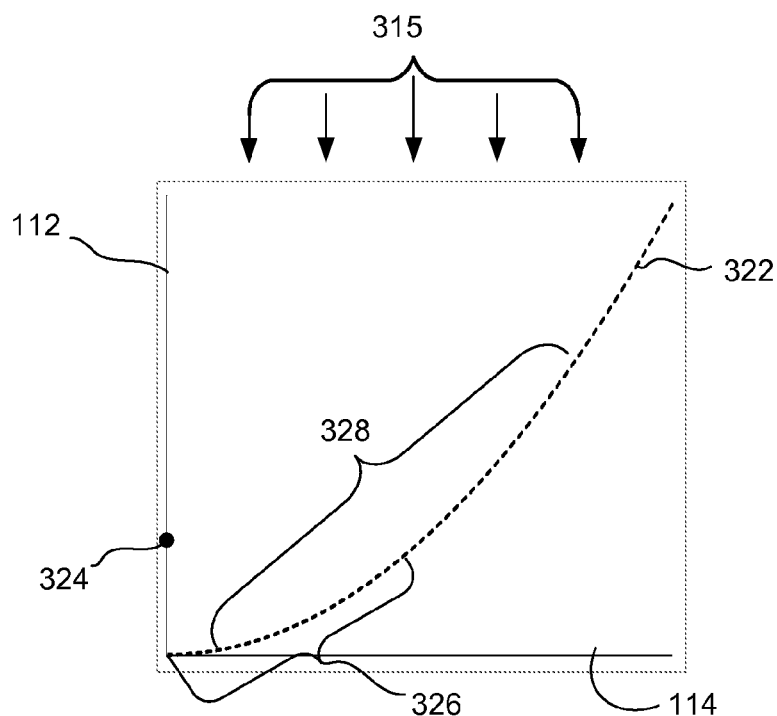

Referring next to FIGS. 3C and 3D, a solar receiver and reflector arrangement 320 according to another embodiment of the present invention will be described. In FIGS. 3A-3B, the solar receivers 304 were generally positioned higher than the highest edge of the associated reflector panel 302. By contrast, FIG. 3C illustrates a solar receiver 304 that is positioned at a height than is in between the heights of the lower and upper edges 312 and 314 of the reflector panel. Since the solar receiver 304 is more centrally located relative to the reflector panel 302, the angles of incidence (in a plane defined by the x axis 114 and the y axis 112) of reflected light on the cell face may be smaller than in other designs where the solar receiver 304 is positioned particularly low or high relative to the reflector panel 302. A reduced angle of incidence may cause less of the light to be reflected off the face of the cell, which helps increase the collection of solar energy. In the illustrated embodiment, the face of the photovoltaic cell 306 on the solar receiver 304 is substantially perpendicular to the optical aperture 308 of the reflector panel 302, although in other embodiments it may be tilted.

Referring now to FIG. 3D, possible arrangements of a reflector panel and a solar receiver according to various embodiments of the present invention are described. FIG. 3D illustrates a parabolic curve 322, which represents the shape of one or more possible reflector panels along a plane defined by a y axis 112 and a x axis 114. The focus 324 indicates a location of a photovoltaic cell where these possible reflective panels direct incident sunlight. A first portion 326 of the parabolic curve approximates the shape and the position of the reflector panel in FIG. 3A. A second portion 328 of the parabolic curve approximates the shape and position of the reflector panel in FIG. 3C. Any number of reflector panels can be imagined that have reflective surfaces that conform substantially with the parabolic curve, which is arranged to direct substantially all incoming incident sunlight to the focus 324. A review of FIG. 3D indicates that the degree of curvature of a reflector panel may be affected by whether the solar receiver is positioned high, low or centrally relative to those solar receivers. It should be appreciated that FIG. 3D is applicable only to some of the embodiments contemplated by the present invention and that the present invention contemplates other embodiments in which the reflector panels have other curvatures, arrangements and/or shapes.

Figure 4A:
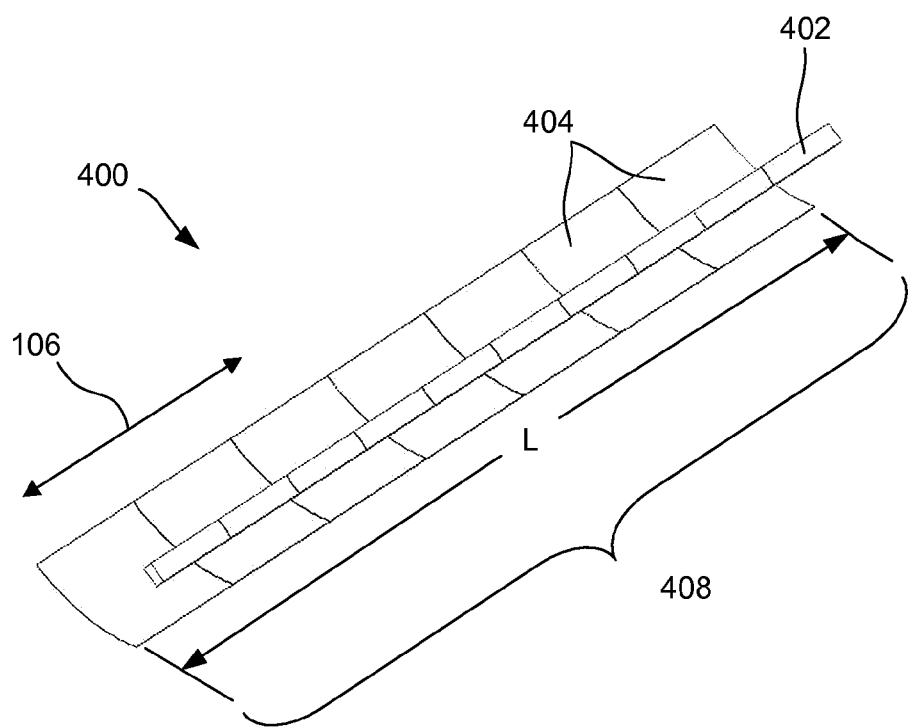
FIGS. 4A and 4B are diagrammatic perspective and cross-sectional views of a collector unit according to a particular embodiment of the present invention.
Figure 4B:
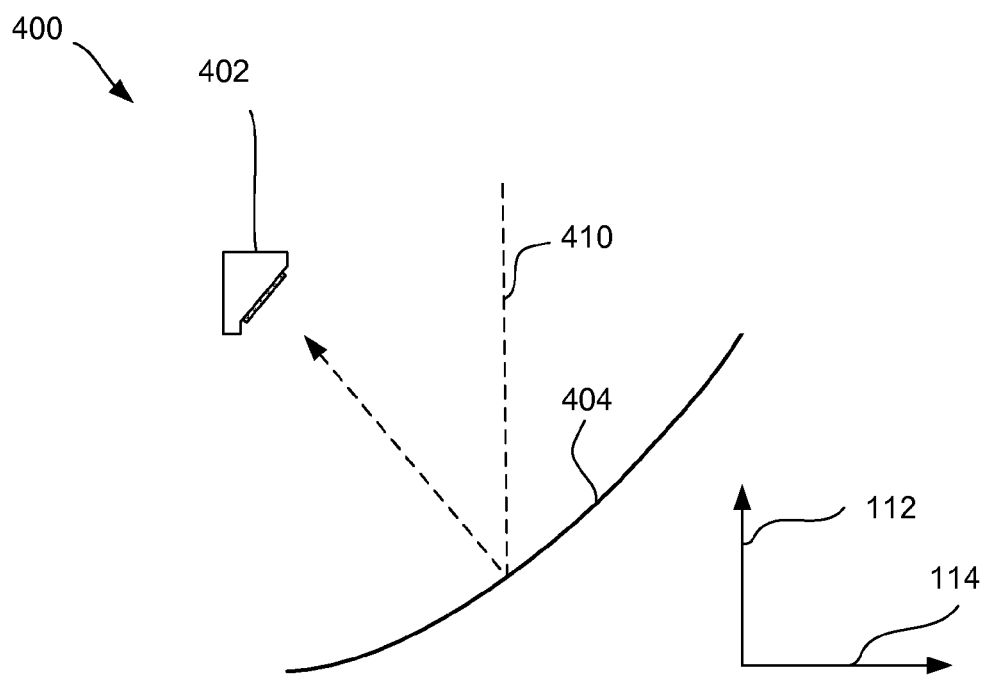

Referring next to FIGS. 4A and 4B, a collector unit 400 according to a particular embodiment of the present invention will be described. The collector unit 400 may represent a stand alone structure, or it may be understood as a basic building block for many other designs. That is, multiple collector units 400 may be arranged together to form a wide variety of collector designs, some of which are described in FIGS. 5A-5C and FIGS. 6A-6C. FIG. 4A illustrates a diagrammatic perspective view of a collector unit 400 that includes one or more solar receivers 402 and one or more reflector panels 404. FIG. 4B illustrates a cross-sectional view of the collector unit 400, which may also have any of the features described in connection with FIGS. 2A-2C and 3A-3D. The collector unit 400 is arranged such that the reflector panels 404 direct incident sunlight 410 to the solar receivers 402. The reflected light forms a flux line on the receivers 402 that extends longitudinally down the length of the collector unit.

As discussed previously with respect to other embodiments, the design of the collector unit 400 offers several advantages. Because the reflective surface of the reflector panels 404 is positioned in close proximity to the solar receivers 402, the light need not traverse a long distance between the reflector panels 404 and the solar receivers 402, which improves mechanical and tracking tolerances for the collector. Additionally, the solar receivers 402 are positioned over a region just outside a lower edge 406 of the reflective surface. As a result, the solar receiver 402 (and any associated support structures) do not shade the reflective surface and do not prevent incident sunlight from reaching the reflective surface.

Some collector units involve multiple solar receivers and reflector panels that are arranged in rows that run parallel to one another along a longitudinal axis. In the illustrated embodiment, for example, multiple longitudinally adjacent reflector panels 404 cooperate to form a reflector 408 with a substantially continuous reflective surface. The solar receivers 402 are also arranged longitudinally adjacent to one another to form a solar receiver row that extends in the longitudinal direction 106. The length of the solar receiver row is generally substantially similar to that of the length L of the reflector. In various implementations, however, the solar receiver row may be somewhat longer or shorter than the reflector. It should be appreciated that although the figure illustrates ten solar receivers 402 in the solar receiver row and seven reflector panels 404 forming the reflector, almost any suitable number or combination of solar receivers and reflector panels may be used.

Figure 5A:
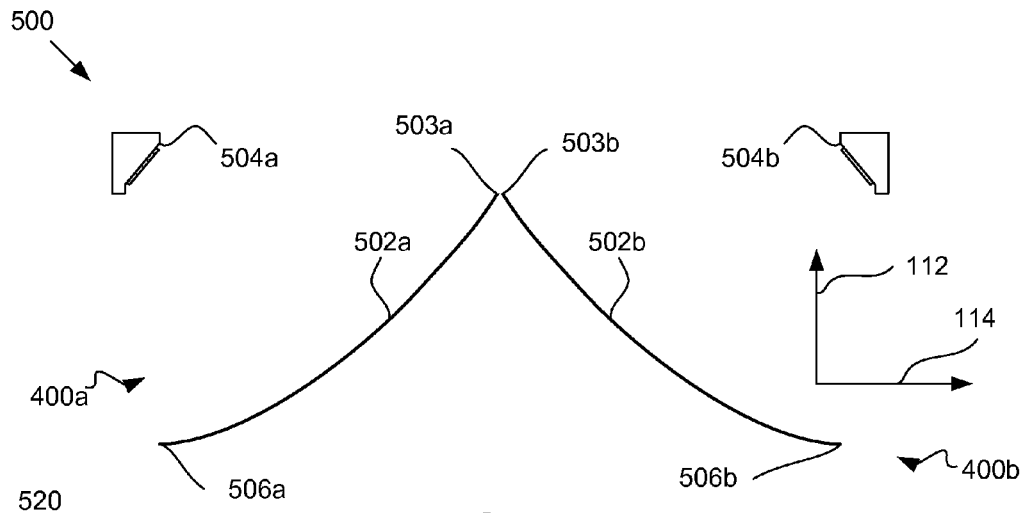
FIGS. 5A-5C and 6A-6C are diagrammatic cross-sectional views of various collectors that are formed from different arrangements of the collector units illustrated in FIGS. 4A and 4B.

Multiple collector units 400 may be arranged in a wide variety of ways to form different types of solar collectors. Some examples are provided in FIGS. 5A-5C. FIG. 5A illustrates a solar collector 500 made of two collector units 400a and 400b in which the first and second reflectors 502a/502b are arranged with their backsides to one another in a tent-like arrangement. In the illustrated embodiment, the first and second reflectors 502a/502b are arranged substantially symmetrically around the center of the collector. A reflective surface on each reflector 502a/502b has a parabolic or otherwise curved shape. The first and second reflectors 502a/502b are arranged to form an A-like shape, i.e. the inner edges 503a/503b of the reflectors 502a/502b are positioned adjacent to one another at the middle of the collector, the reflectors 502a/502b curve inward relative to one another, and the outer edges 506a/506b of the reflectors 502a/502b are positioned at the periphery of the collector 500 and at a lower height than the inner edges 503a/503b of the reflectors 502a/502b. The first and second solar receivers 504a/504b are positioned above a peripheral region outside the outer edges 506a/506b of the first and second reflectors 502a/502b, respectively, and are physically supported by receiver support structures. An advantage of this implementation is the location of the solar receivers 504a/504b at the periphery of the collector 500, which allows easy access to the receivers for installation, cleaning and repair. Additionally, the solar receivers 502a/502b are somewhat removed from other collector components, which may facilitate heat dissipation.

Figure 5B:
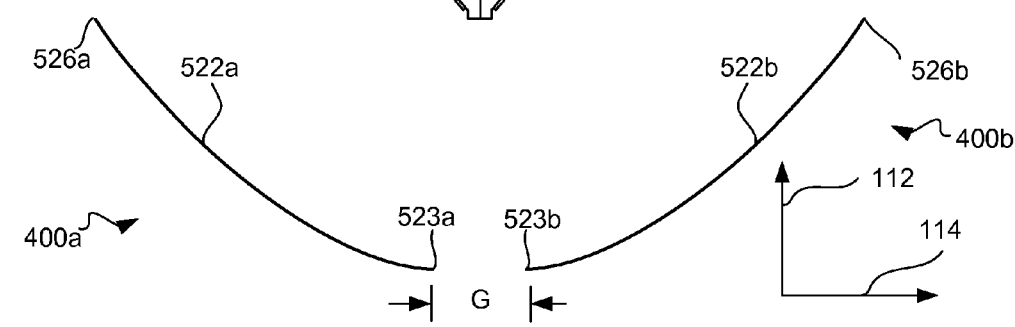

FIG. 5B illustrates a different way of arranging two collector units 400a/400b. In the illustrated embodiment, the first and second reflectors 522a/522b, which may have a curved or parabolic shape, are substantially symmetrically arranged and curve outward to form a trough- or U-like shape. That is, the inner edges 523a/523b of the reflectors 522a/522b are positioned closer to the middle of the collector 520, while the outer edges 526a/526b of the reflectors 522a/522b are positioned at the periphery of the collector 520. The outer edges 526a/526b are positioned higher than the inner edges 523a/523b, which results in the formation of a U-type design. Two solar receivers 524a/524b, whose respective photovoltaic cells face away from one another, are positioned over a central region between the inner edges 523a/523b of the reflectors 522a/522b. An advantage of this implementation is that the two solar receivers 524a/524b are positioned at a single location, which means that fewer structures are required to physically support them then if they were separated across the width of the collector 520.

Figure 5C:
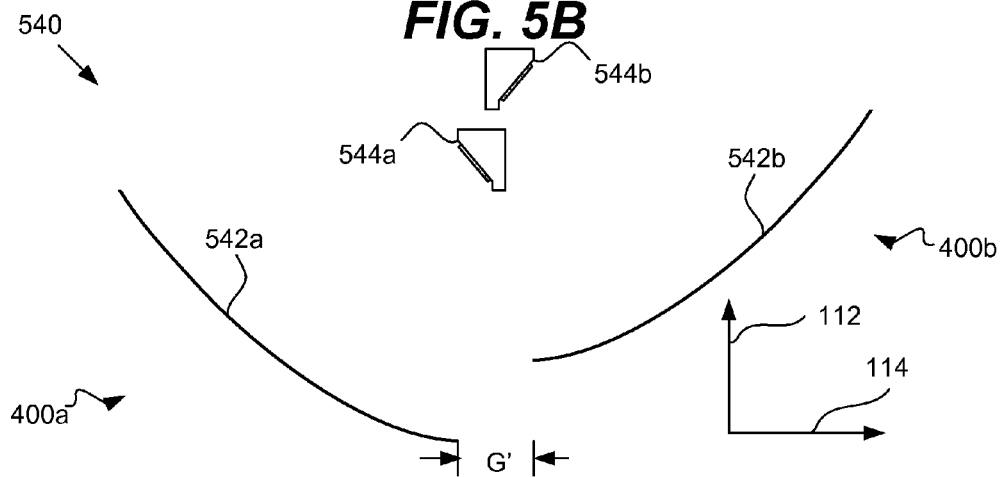

FIG. 5C illustrates a collector 540 in which the collector units 400a/400b are staggered at different heights. Rather than being arranged side-by-side, the second solar receiver 544b is positioned over and shades the first solar receiver 544a. To maintain its proper alignment with the second solar receiver 544b, the second reflector 542b is positioned higher than the first reflector 542a. That is, the collector 540 is generally symmetrical between the two collector units 400a/400b, except that the collector units are offset along the vertical y axis 112. An advantage of this design is that the solar receivers 544a/544b take up less space along the x axis 114. A review of FIG. 5C indicates that the pairs of solar receivers 524a/524b and 544a/544b of FIGS. 5B and 5C take up a distance G and G', respectively, which extends along the x axis 114. Because the two solar receivers 544a/544b in FIG. 5C are stacked over one another, the distance G' of the collector 540 in FIG. 5C is substantially less than the distance G of the collector 520 in FIG. 5B. As a result, the ratio of the reflective area of the collector to the total area of the collector is increased, which means that for the same amount of real estate, more light is directed to the photovoltaic cells of the collector 540 in FIG. 5C.

Figure 6A:
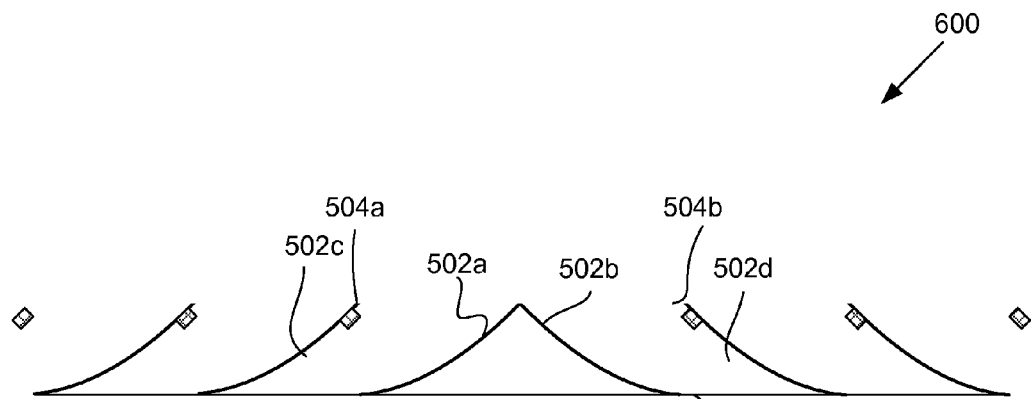
Figure 6B:
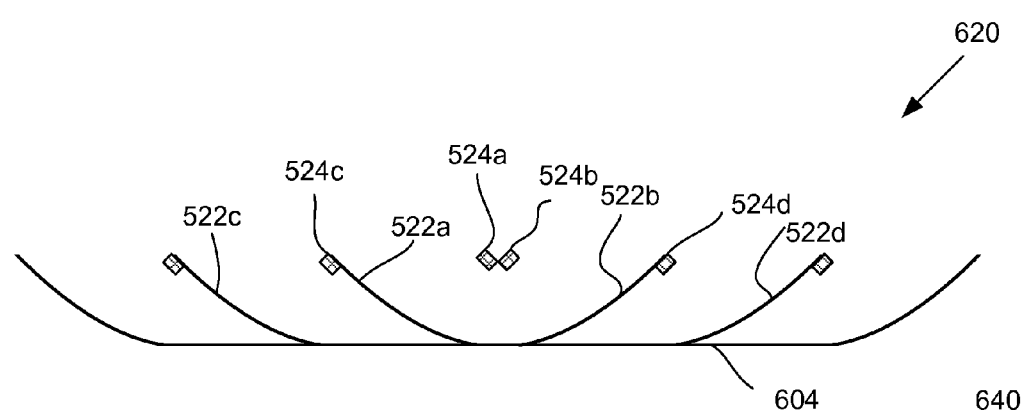
Figure 6C:
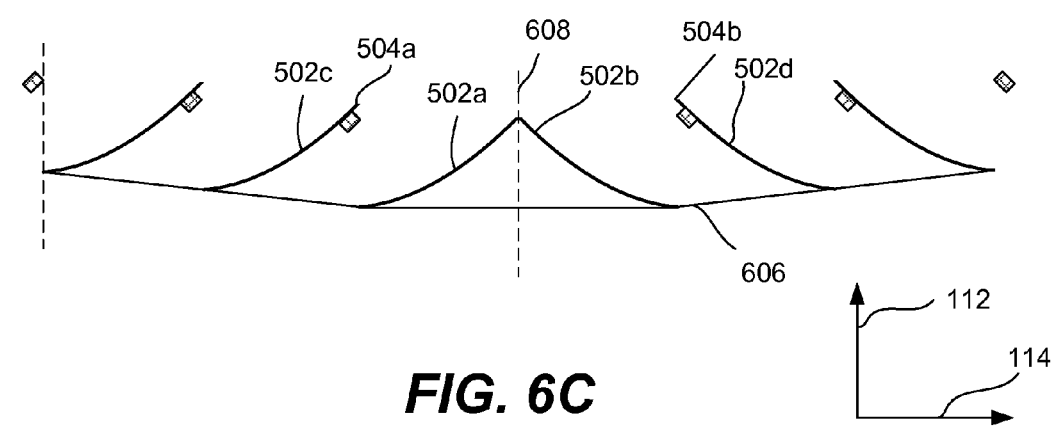

Referring next to FIGS. 6A-6C, extended solar collectors in accordance with various embodiments of the present invention will be described. Each extended solar collector involves multiple collector units that are coupled with a common base. The common base allows a larger number of reflectors and solar receivers to be part of a single collector structure that can be pivoted to track the movements of the sun.

FIG. 6A relates to an extended collector 600 that is an extended version of the A-type collector illustrated in FIG. 5A. That is, in addition to the reflectors 502a/502b and solar receivers 504a/504b illustrated in FIG. 5A, the extended collector includes at least a third reflector 502c and a fourth reflector 502d. The third and fourth reflectors 502c/502d are positioned outside the outer edges of the first and second reflector panels 502a/502b, respectively, and are oriented in a similar manner (e.g., curving inwards towards a central region of the collector, with the inner edges being higher than the outer edges.) Each reflector has a reflective surface and an opposing backside surface. The reflective surface of each reflector is arranged to direct incident light to one of the solar receivers. The first and second solar receivers 504a/504b are positioned near the inner edges and on the backsides of the third and fourth solar receivers 502c/502d, respectively. As a result, it is not necessary to use a separate structure to support the solar receivers 504c/504d, since the reflectors 502c/502d can be used to hold the solar receivers in position. In the illustrated embodiment, there are two more reflectors and two more solar receivers in the collector beyond the ones described above, that essentially repeat the aforementioned receiver-reflector arrangement (e.g., each reflector is arranged to direct sunlight to a solar receiver that is on the backside of the next reflector, except for the solar receivers at the far ends of the collector 600.) It should be appreciated that fewer or more reflectors and solar receivers may be used. All of the reflectors and receivers are mounted on a common base structure 602 that can be pivoted along at least one axis to track incident sunlight.

FIG. 6B relates to an extended collector 620 that is an extended version of the U-type collector 520 illustrated in FIG. 5B. That is, in addition to the reflectors 522a/522b and solar receivers 524a/524b illustrated in FIG. 5B, the extended collector 520 includes at least a third reflector 522c and a fourth reflector 522d. The third and fourth reflectors 522c/522d are positioned outside the outer edges of the first and second reflectors 522a/522b, respectively, and are oriented in a similar manner (e.g., curving outwards away from a central region of the collector, with the outer edges being higher than the inner edges.) Additional third and fourth solar receivers 524c/524d are attached with the backsides of the first and second reflectors 522a/522b. The third and fourth reflectors 522c/522d are arranged to direct incident light into the third and fourth solar receivers 524c/524d, respectively. The solar receivers 524a-524d and reflectors 522a-522d are mounted on a common base structure 604 that is arranged to pivot in order to track movements of the sun. Additional reflector panels and solar receivers may be attached with the common base structure 604 in the manner of the third and fourth solar receivers 524c/524d and the third and fourth reflectors 522c/522d to further expand the reflective area and power generating capacity of the solar collector 620.

FIG. 6C illustrates an extended collector according to another embodiment of the present invention. The features of the collector 640 are almost identical to those of the collector 600 in FIG. 6A, except that at least some of the reflectors 502a-502d are at different heights. In the illustrated embodiment, for example, the collector 640 is symmetrical along a bisecting axis 608 and the common base structure 606 supports at least some of the reflectors on each side of the bisecting axis 608 such they are offset from one another along the vertical y axis 112.

It should be appreciated that FIGS. 5A-5C and 6A-6C provide only a few of the possible arrangements of reflectors and solar receivers that are contemplated in the present invention. Although most of the figures involve substantially symmetrical collector designs, in some embodiments the designs may instead be asymmetrical. The reflector panels and solar receivers of each solar collector may or may not have substantially identical dimensions and/or shapes in the same collector. The common base structures 602/604/606 of FIGS. 6A-6C are drawn diagrammatically as platforms with flat surfaces, but it should be appreciated that a base structure may take a wide variety of forms, including a space frame support structure, multiple separate support structures, etc.

Figure 7A:
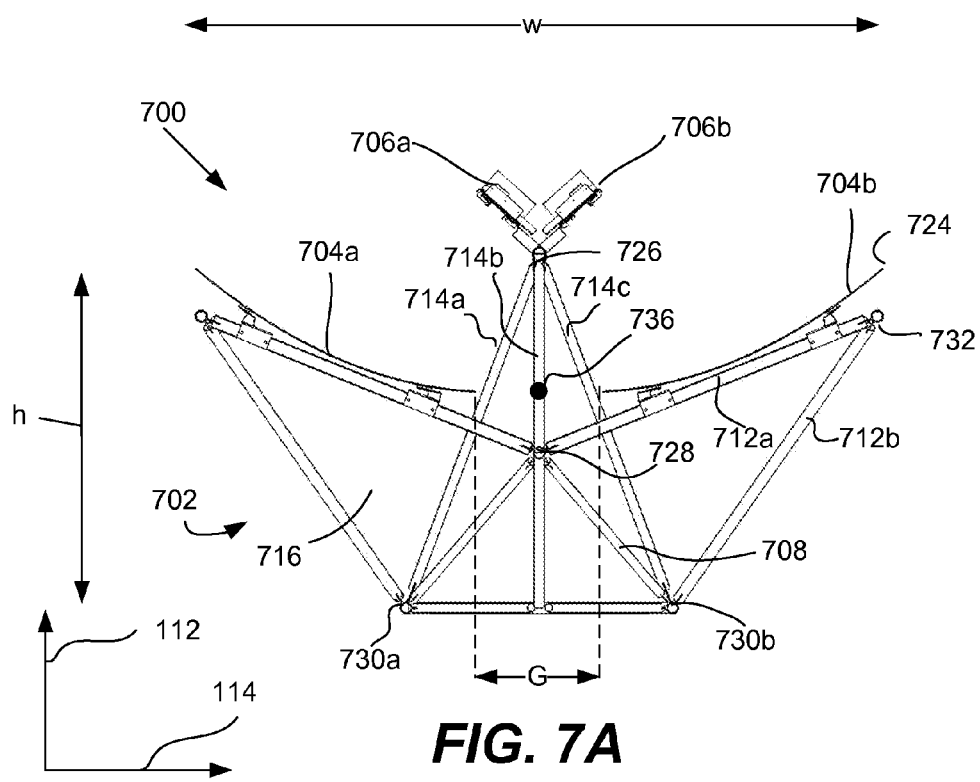
FIGS. 7A-7D are diagrammatic cross-sectional and perspective views of a solar collector with a space frame support structure in accordance with various embodiments of the present invention.
Figure 7B:
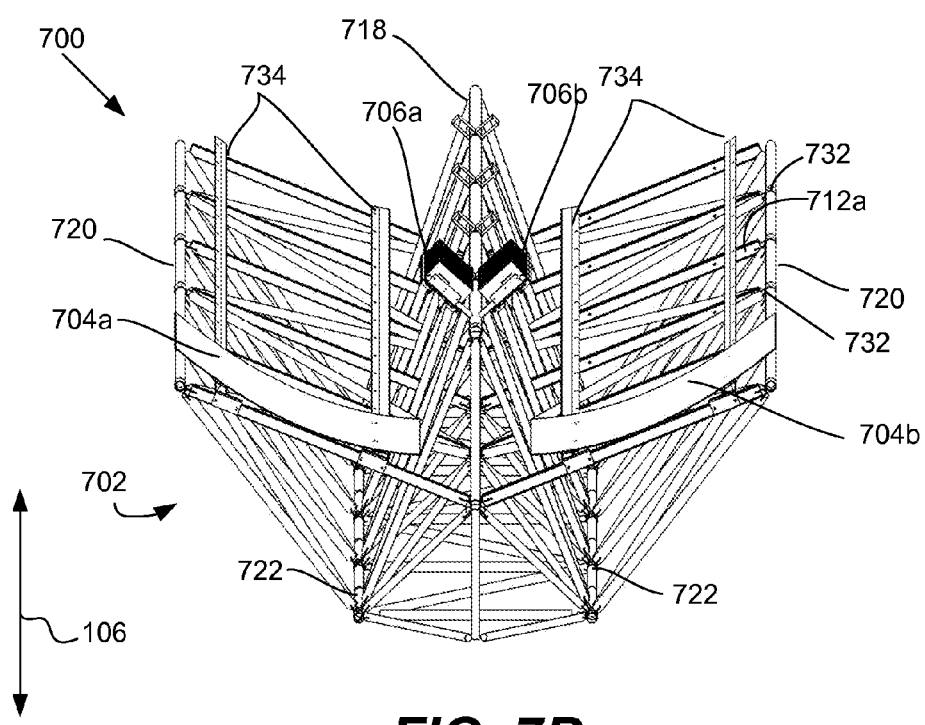
Figure 7C:
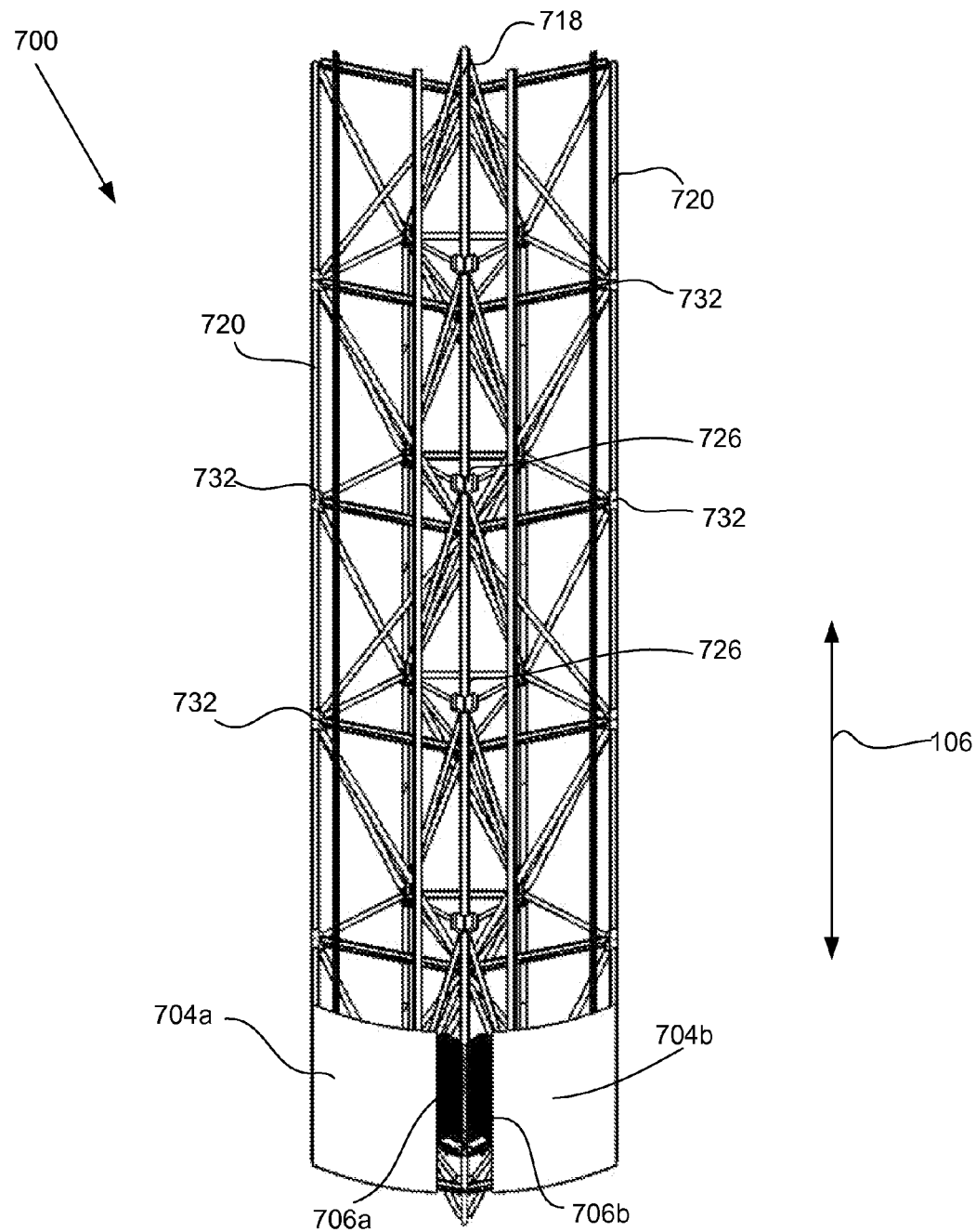

Referring next to FIGS. 7A-7C, a space frame support structure 702 for use in a solar collector 700 according to a particular embodiment of the present invention will be described. FIG. 7A illustrates a diagrammatic cross-sectional view of an U-type collector 700 (e.g., as described in FIGS. 1A-1B and 5A), which includes a space frame support structure 702 that physically supports the solar receivers 706a/706b and the reflector panels 704a/704b. FIGS. 7B and 7C illustrate diagrammatic perspective views of the collector 700, with some of the reflector panels removed to reveal more of the underlying space frame. The space frame support structure 702 includes multiple struts that are connected at nodes. The struts 708 include one or more receiver support struts 714a/714b/714c and one or more reflector support struts 712a/712b.

The space frame support structure 702 is arranged to disperse loads originating at the solar receivers 706a/706b and the reflector panels 704a/704b. In the illustrated embodiment, for example, the receiver support struts 714a/714b/714c are linear pipes, tubes, or cylinders that extend diagonally out from a location immediately underneath the solar receivers to one or more nodes within the space frame. As a result, loads originating at the solar receivers are largely converted into compressive or tensile forces on one or more of the underlying struts, which are better tolerated. Additionally, the structures that are supporting the receiver and reflector panels are not physically isolated from the rest of the rest of the space frame support structure, which may render them more vulnerable to bending or damage. Instead, components such as the receiver support structures are integrated into the overall space frame support structure such that the loads from the solar receivers are carried not only by the structures that are in direct contact with them, but also by the rest of the space frame support structure. The space frame support structure 702 may be viewed as a unitary structure, since it supports and distributes the loads from both the solar receivers 706a/706b and the reflector panels 704a/704b in an integrated or unitary fashion.

Various implementations involve a space frame support structure 702 that is made of linear struts that are connected at nodes to form multiple geometric shapes, such as pyramids, tetrahedrons, etc. These shapes help to disperse stresses from carried components through multiple paths within the space frame. The space frame support structure has large apertures 716 and internal spaces that allow the passage of air, which substantially reduces wind load on the collector 700. The large apertures 716 also facilitate cleaning of and access to the space frame support structure 702 and are less likely to catch debris.

Generally, the space frame support structure 702 is arranged to minimize or eliminate any shading of the reflector panels 704a/704b. In some embodiments, no portion of the solar receivers, the space frame support structure or any part of the solar collector shades the reflector panels 704a/704b during the normal operation of the solar collector.

The space frame support structure may include multiple, longitudinally extended longerons that form a base framework for the rest of the space frame support structure. The longerons may be continuous tubes substantially equal in length to the collector length. The tube cross-section may be square, rectangular, circular, or some other shape. Struts are attached to nodes on the longerons to create an integrated, web-like, highly resilient structure. (The term "longeron" may be understood in the present application as any suitable type of linear member that extends in a longitudinal direction.) For example, FIGS. 7B-7C illustrate a space frame support structure 702 that includes an upper longeron 718, side longerons 720 and lower longerons 722. Each longeron is a linear member that extends along a longitudinal axis 106. The upper longeron 718 is arranged to physically support one or more solar receivers 706a/706b. The side longerons 720 are positioned near the outer edges 724 of the reflector panels 704a/704b and may indirectly help to support the panels. The lower longerons 722 are arranged at a bottom portion of the space frame support structure 702. All of the longerons extend substantially parallel to one another along the longitudinal axis 106.

Each of the longerons have multiple nodes that are separated by gaps and are distributed along the length of the longeron. The nodes are connecting points for multiple additional struts that can cause forces to be dispersed through multiple paths. For example, the upper longeron 718 has multiple upper nodes 726 along its length. In some embodiments, each upper node 726 is adjacent to and directly underlies one or more solar receivers 706a/706b, although this is not a requirement. Multiple receiver support struts 714a/714b/714c extend diagonally downward from each upper node 726 to help support the solar receivers 706a/706b. While the upper longeron 718 may experience some bending force, the receiver support struts 714 are subject primarily to tensile or compressive loads. Force that is applied to the solar receivers 706a/706b is dispersed through multiple, suitably angled receiver support struts 714a/714b/714c, rather than a single support member.

The solar receivers 706a/706b may be attached at multiple points along the upper longeron 718. The attachment points may be located at regular intervals along the longeron. These attachment points need not correspond with space frame nodes. If the longeron is formed from a rectangular tube, the attachment to the longeron may include a U-shaped channel that fits over the longeron. Both the longeron and the U-shaped may include holes. The U-shaped channel may be secured to the longeron by aligning these holes and inserting a fastener through the holes.

In some designs, the receiver support struts 714 fan out from the upper nodes 726 and connect to various nodes deeper within the space frame support structure. By way of example, in FIG. 7A, one receiver support strut 714b extends straight down and directly underneath the solar receivers 706a/706b and is coupled to a central node 728 in the space frame support structure. Two other receiver support struts 714a/714c extend diagonally downward to lower nodes 730a/730b, respectively, which are coupled to the lower longerons 722 at the bottom of the collector 700. In the illustrated embodiment, the lower nodes 730a/730b are positioned below the reflector panels. While FIG. 7A illustrates three receiver support struts 714a/714b/714c extending out an upper node 726, it should be appreciated that there may also be more or fewer receiver support struts extending out of the upper node or any single node.

There are also multiple side nodes 732 that are separated by gaps and are distributed along the length of each side longeron 720. Multiple reflector support struts 712a/712b extend diagonally out from each side node 732 to help physically support the reflector panels. One of these struts 712a, which extends towards and is coupled to the side longeron 720, is coupled to the central node 728. Another is coupled to the lower node 730b and also extends to the side longeron 720. The two reflector support struts 712a/712b are attached to the side longeron 720 via the same side node 732.

The reflector support struts 712a/712b cooperate to form a base upon which the reflector panels 704a/704b may be positioned. Various implementations involve reflector support struts 712a/712b that extend in a direction substantially perpendicular to the upper and side longerons 718/720. To further facilitate the mounting of reflector panels 704a/704b to the space frame support structure 702, one or more stringers 734 may be positioned over the aforementioned receiver support struts 712a. In the illustrated embodiment, for example, the stringers 734 overlie and extend perpendicular to the receiver support struts 712a. Each stringer 734 includes one or more attachment points for attaching to an overlying reflector panel. The stringers 734 provide additional stiffness to facilitate more accurate alignment of the reflector panel. Together with the reflector support struts 712a/712b, the stringers 734 also help to distribute the load of the reflector panels more evenly over the space frame. Generally, stringers 734 facilitate the mounting of different sized reflector panels, since they may be substantially invariant along the longitudinal direction, attachment points between the stringers and reflector panels may be installed at any location. In some embodiments, stringers are not used and the reflector panel is attached with a different support member (e.g., a receiver support strut 712a.)

The struts and nodes may take a wide variety of forms, depending on the needs of a particular application. They may be made of almost any suitably resilient material, such as aluminum or steel. For example, tubular aluminum extruded members, roll formed steel sections and hot rolled steel sections work well as struts in the space frame support network. The nodes may be understood as connecting points for multiple struts. Struts can be connected at nodes without a connector (e.g., by form fitting or crushing the struts together, bending the struts around one another, fabricating through holes in one strut for the insertion of another strut, or any other suitable technique.) Welding, metal clinching, adhesive, rivets and bolts may be used to connect struts, connectors and/or nodes of the space frame support structure. In some embodiments, each node includes a separate connector that helps secure the incoming struts. The connector may take any suitable form, such as a metal sphere, a hub, etc. In some implementations, the connector is arranged such that the long axes of the incoming struts are arranged to meet substantially at a single point within the node and/or connector. Struts may be attached to the connector using various mechanisms, including pins, fasteners, bolts, etc.

In the illustrated embodiment, the gap G between the reflector panels 704a/704b is utilized to provide extra structural support for the solar receivers 706a/706b. By widening this gap appropriately, room can be made for multiple receiver support structures 714a-714c that help to stabilize the position of the solar receivers. In any case, a large portion of the gap G is covered by the solar receivers 706a/706b, and thus cannot be used for the reflection of sunlight. In some prior art concentrating photovoltaic systems, this gap between the reflector panels 704a/704b is either non-existent or not wide enough to accommodate a substantial support framework.

The length of the receiver support struts 714a-714c may be adjusted to help make the overall collector more symmetrical around its pivot axis 736. That is, the upward extension of the receiver support struts 714a-714c helps to balance out the lateral extension of the reflector panels 704a/704b. Thus, in various embodiments, the height h to width w ratio of the collector 700 (as measured along a plane defined by the x axis 114 and the y axis 112) is greater than approximately 0.4. A more symmetrical arrangement helps reduce the buildup of stresses on a particular portion of the space frame support structure, even when it is rotated to track movements of the sun.

Figure 7D:
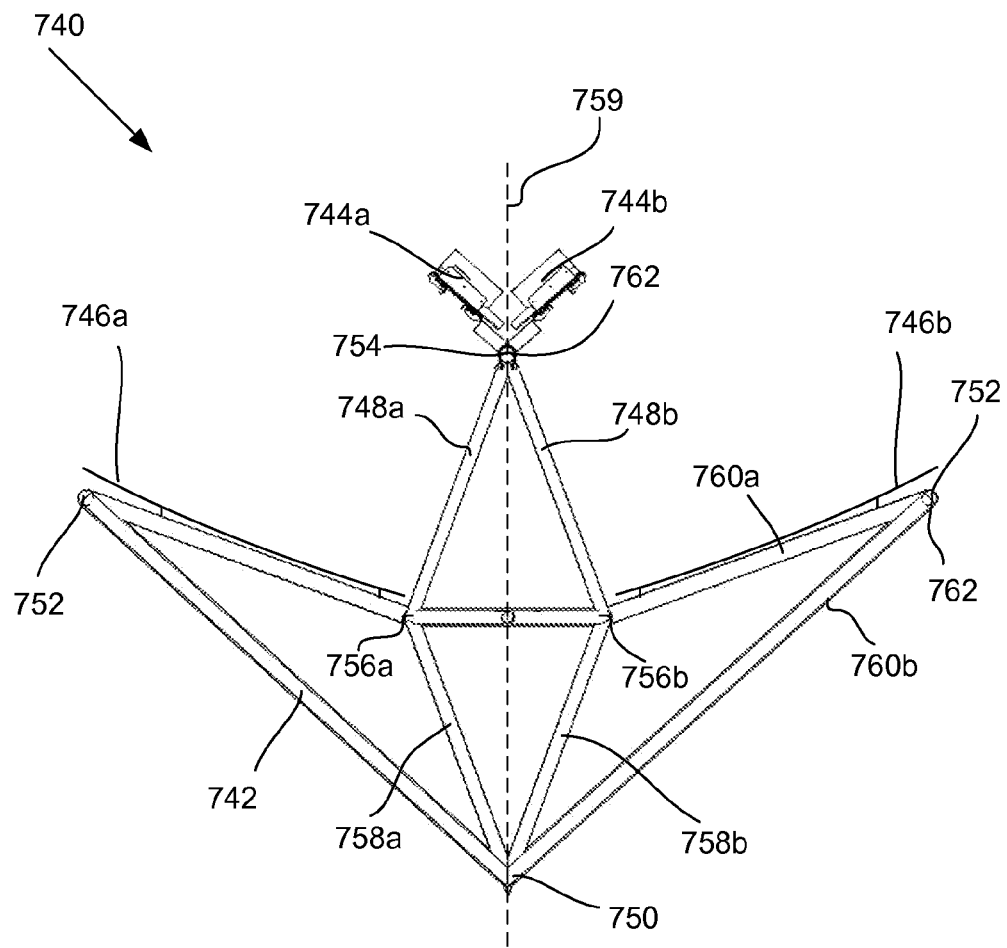

Referring next to FIG. 7D, a solar collector according to another embodiment of the present invention will be described. FIG. 7D is a diagrammatic cross-sectional view of a solar collector 740 that includes a space frame support structure 742 with a different arrangement of struts, nodes and longerons than what was shown in FIGS. 7A-7C. The space frame support structure 742 includes side longerons 752, a single upper longeron 754 and a single lower longeron 750. The upper longeron 754, which is attached to one or more solar receivers 744a/744b through upper node 762, is supported by two receiver support struts 748a/748b that extend diagonally down from the upper longeron 754 and are coupled to two central nodes 756a/756b. Two additional struts 758a/758b connect the central nodes 756a/756b with the single lower longeron 750 to form a diamond shape between the upper longeron 754 and the lower longeron 750. In the illustrated embodiment, the collector 740 is symmetrical along a bisecting plane 759, and both the upper and lower longerons 754/750 are on this bisecting plane 759. Multiple reflector support struts 760a/760b are coupled to and extend from the central and lower nodes 756a/756b/750 to each side longeron 752, where they are attached to the side longeron 752 via the same side node 762. Similar to the space frame support structure 702 illustrated in FIG. 7A, the interconnections and structures illustrated in FIG. 7D may be repeated down the length of the longitudinally extended collector 740 (e.g., there are multiple upper nodes and side nodes arranged along the longitudinal lengths of the upper and side longerons, which may each have the same interconnections as described above.) A notable feature of this space frame design is that any node is limited to a relatively low number of connecting struts (e.g., in the case of FIG. 7D, only four.) For some applications, this feature is desirable, since it makes the node somewhat easier to handle, install and repair.

It should be appreciated that there is almost an infinite number of ways to arrange the longerons, struts and nodes of the space frame support structure. FIGS. 7A-7D should be understood as merely exemplary and should not be interpreted as limiting the range of space frame support structures that are contemplated in the present application.

The use of struts and nodes also makes the space frame support structure relatively easy to ship and assemble. By way of example, individual struts and nodes may be first compactly stored in a shipping container so that they can be assembled almost entirely on-site. Alternatively, portions of the space frame support structure (e.g., interconnected nodes and struts that form a plane of the space frame support structure) may be preassembled prior to shipping. They may be preassembled in planar trusses that can be assembled in the field. Some portions of the space frame support structure (e.g., a planar combination of struts and nodes) may be arranged to be collapsible for shipment and fold out in the field. In particular the planar trusses may be collapsible such that the struts are allowed to pivot about the nodes in such a way as for the planar parts of the truss to collapse into a smaller volume. In another approach, the main body of the space frame supporting structure may be preassembled at the factory, and peripheral components are added on site.

Figure 8A:
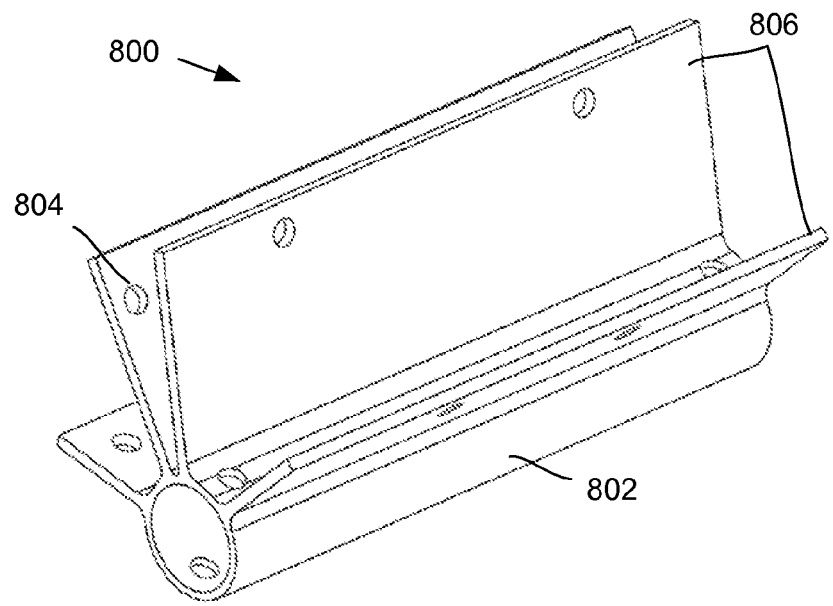
FIGS. 8A and 8B are diagrammatic perspective views of a connector suitable for use in a space frame support structure according to a particular embodiment of the present invention.
Figure 8B:
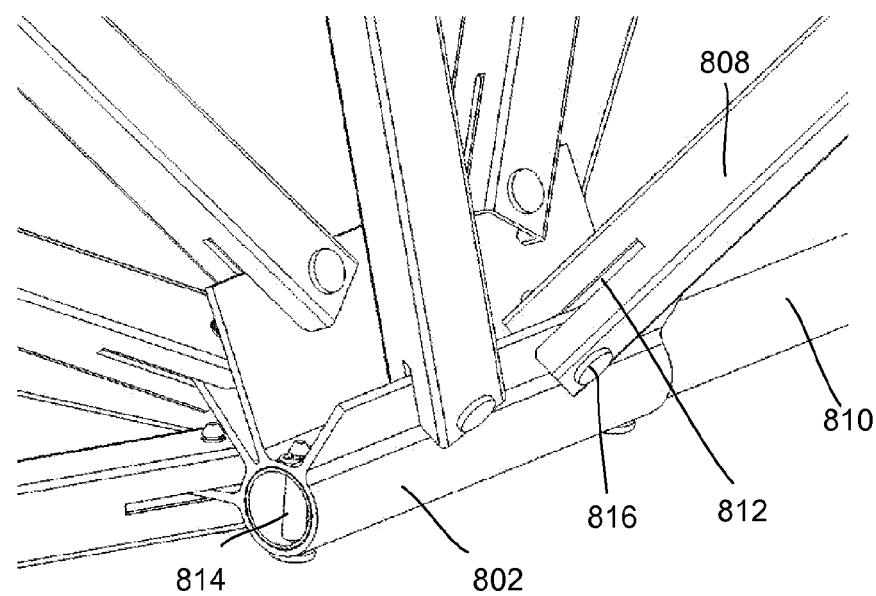

Referring next to FIG. 8A, a connector for use at a node of the space frame support structure according to a particular embodiment of the present invention will be described. FIG. 8A illustrates a connector 800 that includes a body 802 and multiple connector fins 806. The body 802 is arranged to accept a longeron 810, such as one of the longerons described in connection with FIGS. 7A-7D. Each connector fin 806 is a solid sheet or planar surface that extends out of the body 802. Preferably, the body 802 and fins 806 have simple geometries (e.g., cylinders, planes, holes, slots, etc.) so that they are cost-effective to manufacture.

The body 802 of the connector 800 includes a feature for engaging a longeron 810 In the illustrated embodiment, for example, the body 802 is a hollow cylinder with open ends that is arranged to accept a longeron 810. The body 802 may be secured to the longeron 810 using any suitable means, including a pin 814, a bolt, fastener, a latch, adhesive, welding, etc. If a pin is used, the pin may be stepped and the hole diameter in the strut and connector appropriately sized so that each pin step has substantially equal engagement with the hole in the strut or connector.

Each fin 806 is arranged to securely engage one or more additional struts 808. This may be performed in a variety of ways. By way of example, each strut 808 may be a metal tube, bar, rod or cylinder whose end has a slot 812. The edge of the fin 806 of the connector 800 is arranged to slide into the slot 812 of the strut 808. By lining up alignment holes 804 in the fin 806 and the end of the strut 808 and extending a pin 816 through the holes and the slot 812, the strut 808 can be secured to the fin 806. Preferably, the struts 808 contact the connect 800 at substantially different angles to avoid mechanical interference. In some embodiments, a connector 800 and its connected struts 808 are arranged such that the long axes of the incoming connecting struts 808 meet at substantially the same point, which may or may not be in the connector 800.

Figure 9A:
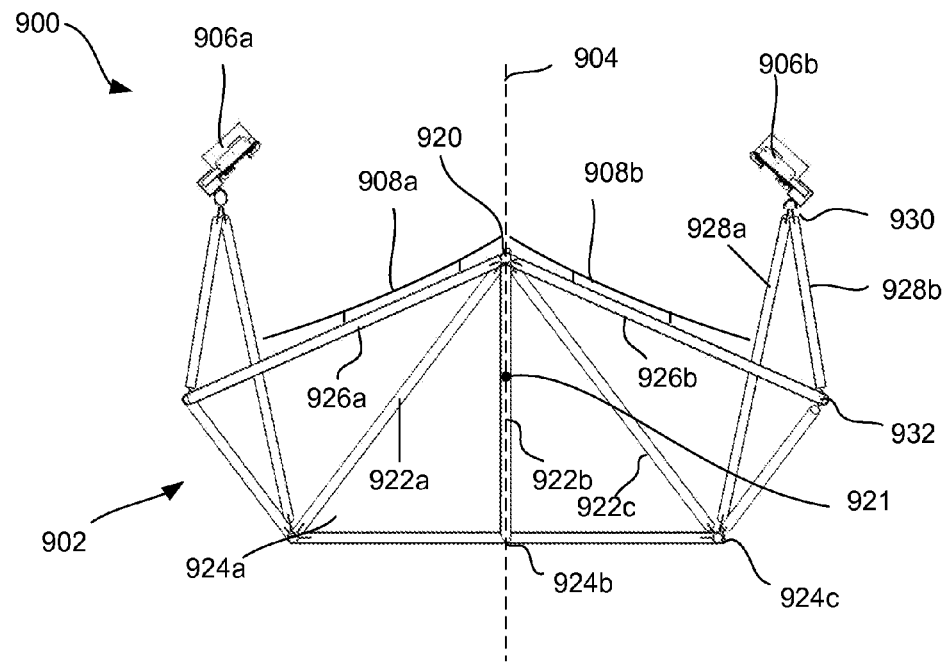
FIGS. 9A and 9B are diagrammatic cross-sectional and perspective views of a solar collector with a space frame support structure in accordance with another embodiment of the present invention.
Figure 9B:
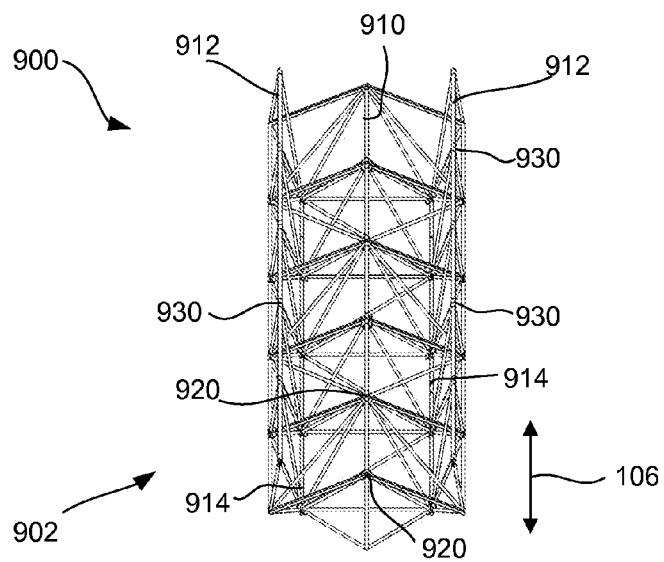

Referring next to FIGS. 9A-9B, a solar collector 900 with a space frame support structure 902 according to another embodiment of the present invention will be described. FIG. 9A is a diagrammatic cross-sectional view of a space frame support structure 902 suitable for use in A-type solar collector, such as the one described in connection with FIG. 5A. FIG. 9B is a diagrammatic perspective view of the space frame space structure 902 illustrated in FIG. 9A. In the illustrated embodiment, the space frame support structure 902 is substantially symmetrical along a bisecting plane 904, although this is not a requirement. The solar collector 900 is arranged to be rotated around pivot axis 921 to track movements of the sun.

The solar collector includes an upper longeron 910, two side longerons 912 and two lower longerons 914 that extend parallel along the longitudinal axis 106 of the solar collector 900. The upper longeron 910, in contrast to the upper longeron 718 of the space frame support structure 702 of FIGS. 7A-7C, does not have attachment sites for solar receivers. Multiple upper nodes 920 are separated by gaps and arranged along the length of the upper longeron 910. Multiple support struts 922a/922b/922c fan downward from each upper node 920. Each of these struts 922a/922b/922c are connected to one of the lower nodes 924a/924b/924c. Reflector support struts 926a/926b also extend from the upper node 920 and help physically support and underlie the reflector panels 908a/908b.

The solar receivers 906a/906b are coupled to various attachment sites that are on each side longeron 912. The side longeron 912 is supported by receiver support struts 928a/928b that are positioned at the periphery of the solar collector 900. In the illustrated embodiment, for example, each solar receiver is physically supported by a first receiver support strut 928a and a second receiver support strut 928b. The first receiver support strut extends upward from a lower node 924c to the side node 930. The second receiver support strut extends upward from a peripheral node 932 to the side node 930.

The above arrangement of nodes and support struts are repeated at various points along the length of the longerons and the space frame support structure 902. That is, there are multiple upper nodes 920, which are separated by gaps, along the length of the upper longeron 910. Support structures 922a-922c fan downward from each of these upper nodes 920 in the manner described above. Similarly, there are side nodes 930, separated by gaps, along the length of each side longeron 912. Receiver support struts 928a/928b extend diagonally downward from each of these side nodes 930 to corresponding lower and peripheral nodes 924c/932. As a result, a lattice of interlocking struts and nodes is formed that helps to prevent too much stress from building up on a narrow portion of the support structure.

Figure 10A:
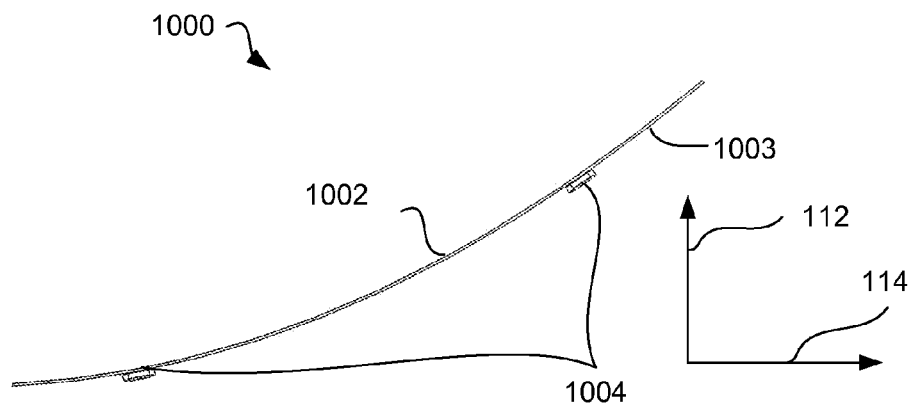
FIGS. 10A and 10B are diagrammatic cross-sectional and perspective views of a reflector panel according to a particular embodiment of the present invention.
Figure 10B:
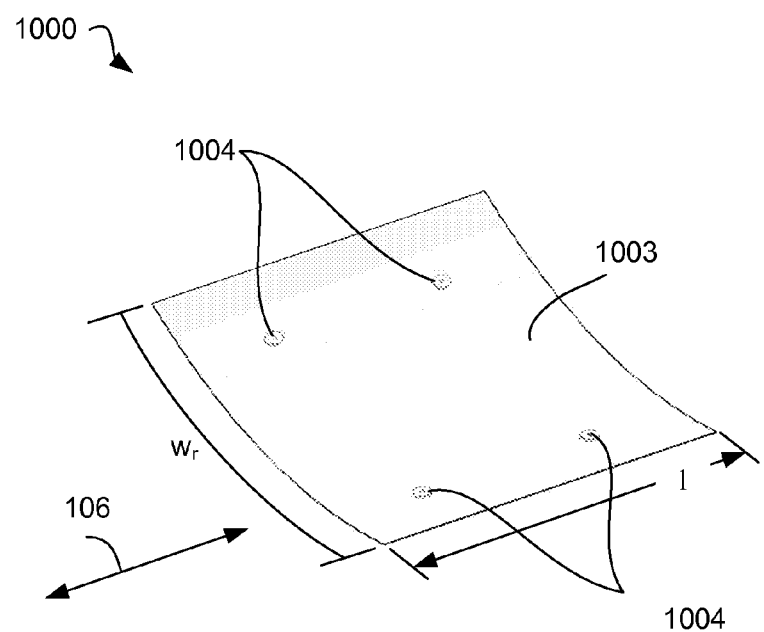

Referring next to FIGS. 10A and 10B, a reflector panel 1000 suitable for coupling to the space frame support structure according to a particular embodiment of the present invention will be described. FIG. 10A is a diagrammatic side view of the reflector panel 1000. FIG. 10B is a diagrammatic perspective view of the reflector panel 1000. The reflector panel 1000 may be understood as an enlarged view of one of the reflector panels illustrated in the previous figures. By way of example, the length l of the reflector panel 1000 may correspond with the length l of the reflector panel 200 illustrated in FIG. 2A. The width $w_r$ of the reflector panel 1000 may correspond with the width $w_r$ of the reflector panel 300 illustrated in FIG. 3A. As previously discussed, the reflector panel 1000 may have a compound curvature e.g., a convex curvature in a plane including the longitudinal axis 106, and a concave curvature along a plane defined by the x and y axes 112/114. The reflector panel has a reflective frontside 1002 and a backside 1003.

The backside 1003 of the reflector panel 1000 includes attachment features 1004 for coupling the panel to the space frame support structure. In various embodiments, for example, the attachment features are used to secure the reflector panel 1000 to the stringers 734 illustrated in FIG. 7B. In still other embodiments, the attachment features are used to secure the reflector panel 1000 to a reflector support strut or other support member. The attachment features may use any suitable means to securely fasten the backside 1003 of the reflector panel 1000 to the underlying support structure. By way of example, the attachment features 1004 may involve adhesive, glue pads, holes, fasteners or threaded screw holes.

The reflector panel 1000 may have a variety of different compositions and dimensions, depending on the needs of a particular application. Any reflective material, such as metalized glass, aluminum, etc, may be used to form the reflector panel. The reflective panel 1000 may be rectangular, curved, parabolic, flat, and/or arranged in the form of rectangular sheets or longer strips (e.g., as shown in FIG. 3B). In various embodiments, all of the reflector panels of a particular solar collector have the same dimensions and curvatures, although in other embodiments the panels may differ in their shape and size.

Figure 11:
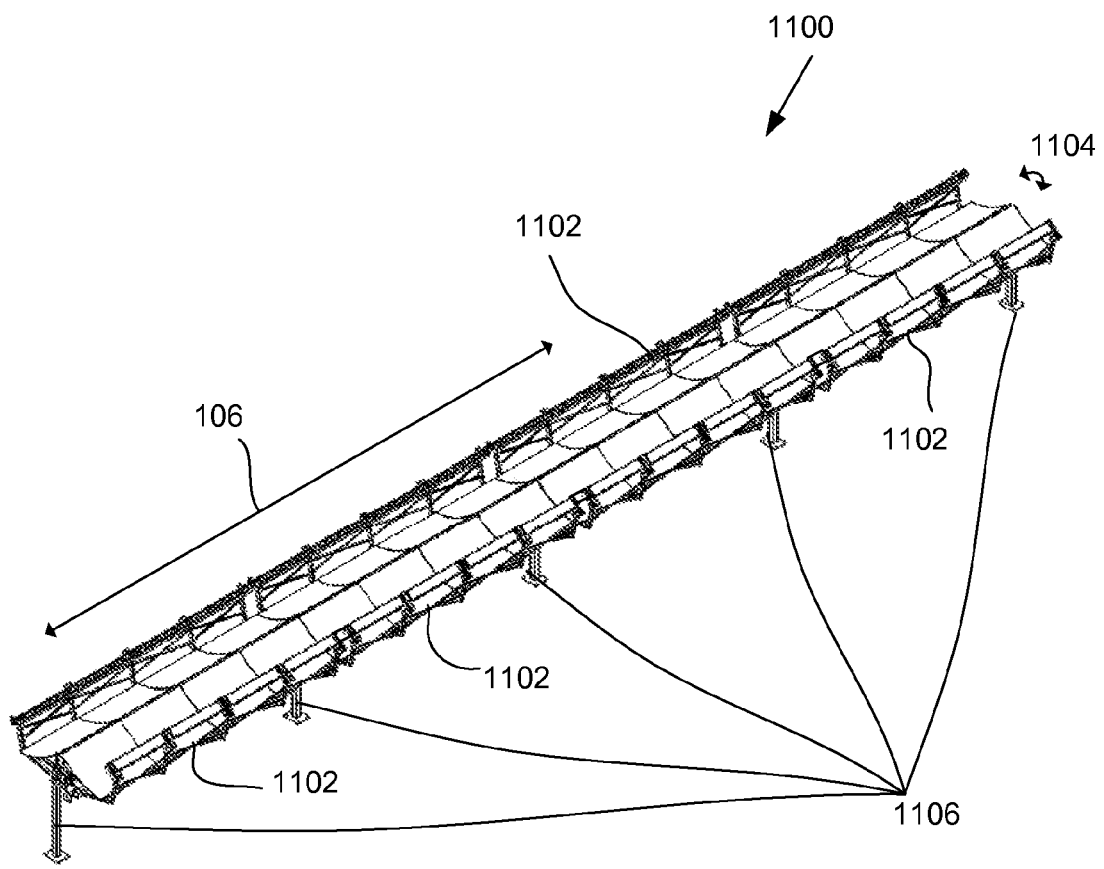
FIG. 11 is a diagrammatic perspective view of multiple solar collectors that are arranged to form a solar collector row in accordance with a particular embodiment of the present invention.

Referring next to FIG. 11, a solar collector row 1100 according to a particular embodiment of the present invention will be described. FIG. 11 is a diagrammatic perspective view of a solar collector row 1100 that includes multiple solar collectors 1102 that have been arranged adjacent to one another along a longitudinal axis 106. Multiple mounting posts 1106 form a stand, which physically support the solar collector row for pivotal motion 1104, are positioned at the ends and at various points along the length of the collector row. The illustrated collectors may be any of the collectors described in the present application.

Preferably, the solar collectors 1102 are coupled together such that they pivot together in tandem to track movements of the sun. Coupling devices (not shown) are positioned underneath adjacent collectors 1102 to help link the collectors 1102 together. Some embodiments of the collector include a space frame support structure with short tube assemblies at the longitudinal ends of the collector, which are each arranged to be connected with a coupling device. Each coupling device is in turn supported by one of the mounting posts 1106, which physically supports the solar collector row 1100. When torque is applied to one of the collectors, the torque is transferred through the coupling devices may rotate the entire solar collector row 1100. Various implementations of this approach are described in U.S. patent application Ser. No. 12/846,620, entitled "Manufacturable Dual Trough Solar Collector," filed Jul. 29, 2010, which is incorporated herein in its entirety for all purposes.

The present invention also contemplates a power generation plant that includes multiple solar collectors 1102 and solar collector rows 1100. The solar collector rows 1100 may be arranged in any suitable manner (e.g., in an array, side by side in a parallel formation, etc.) In some embodiments, multiple solar collectors 1102 are positioned on a common carousel type platform that can be rotated to track movements of the sun. All the collectors on the carousel rotation axis may rotate about a common rotation axis. The rotation axis may be substantially vertical. In various embodiments, the collector longitudinal axes may lie in a substantially horizontal plane, or the collector longitudinal axes may have a fixed, oblique tilt angle relative to the rotation axis. Alternatively, the collectors may be rotated about two axes. Such approaches are described in greater detail in U.S. patent application Ser. No. 12/642,704, entitled "High Ground Cover Ratio Solar Collection System," filed Dec. 18, 2009, which is hereby incorporated in its entirety for all purposes.

Figure 12:
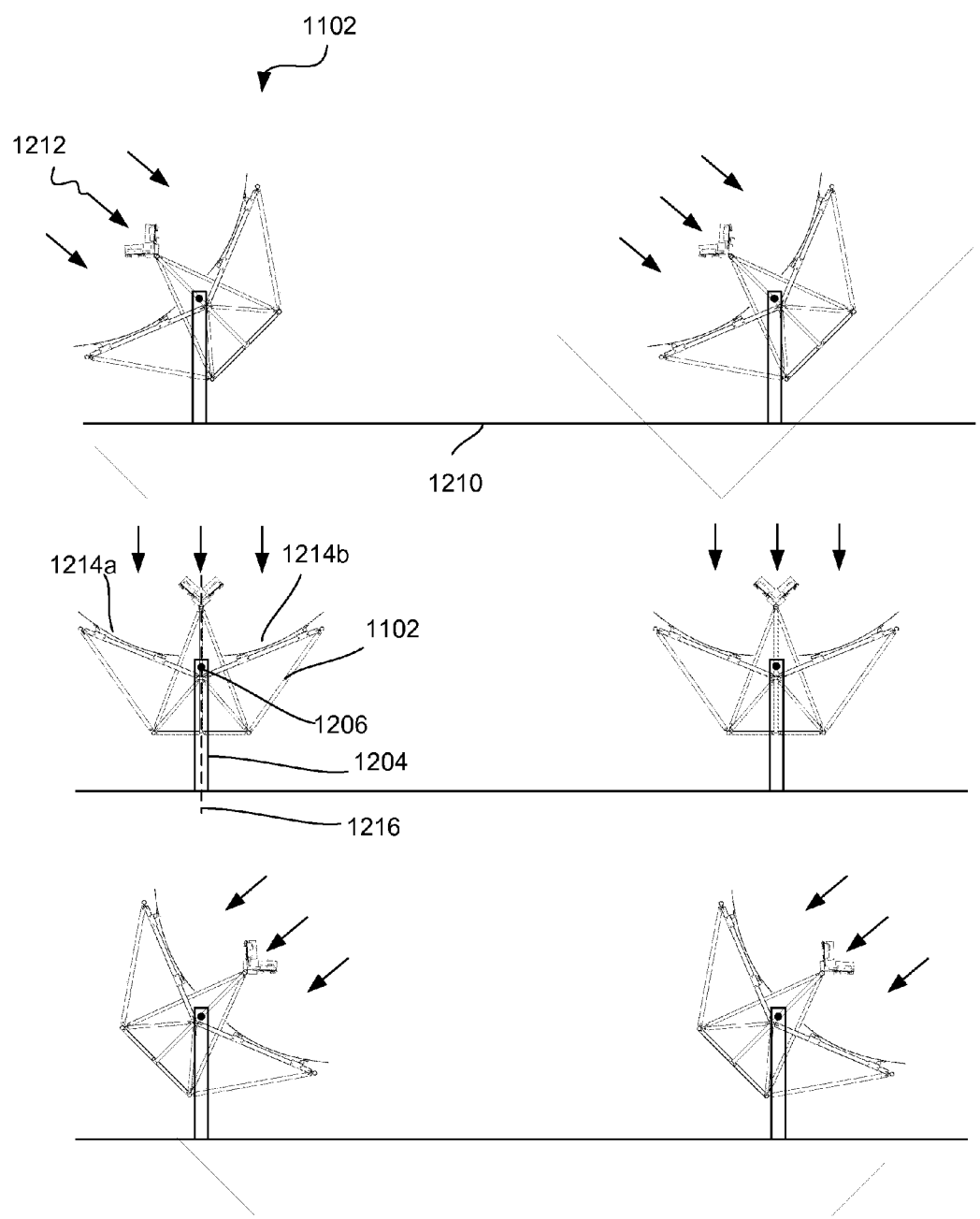
FIG. 12 is a diagrammatic cross-sectional view of a solar collector that is suitable for pivoting around an axis in accordance with a particular embodiment of the present invention.

Referring next to FIG. 12, the tracking and pivoting of a solar collector or solar collector row according to a particular embodiment of the present invention will be described. FIG. 12 is a diagrammatic end view of solar collectors 1102 that are at the ends of two of the solar collector rows 1100 illustrated in FIG. 11. The two solar collector rows 1100 are arranged in parallel and extend in a longitudinal direction (i.e., into the page). A mounting post 1204 physically supports each solar collector for pivotal movement around a pivot axis 1206 that also extends in the longitudinal direction. The mounting posts 1204 may be anchored into the ground or a common base 1210 (e.g., a roof top, car park cover, etc.) A tracking system is arranged to pivot the solar collector to track the movements of the sun, such that the incoming sunlight 1212 is substantially incident on the optical aperture of the collector 1102.

Various designs involve a pivot axis 1206 that substantially passes through the center of gravity of each collector in a solar collector row 1100. That is, the weight of the various components of the collector 1102 are distributed evenly around the pivot. As a result, less force is required to rotate the collector 1102. The location of the center of gravity of the collector 1102 depends on the weights of the various components. By way of example, it may be located along a bisecting plane 1216 of the collector and/or between the reflector panels 1214a/1214b. Some embodiments involve adding weights to the bottom of the collector 1102 to push the center of gravity lower. An economical and simple way to do so is to fill some of the lower struts or longerons with solid material, such as gravel, cement, sand, earth or steel balls.

The solar collector 1102 is arranged to accommodate a wide range of motion around the pivot axis. In some embodiments, for example, the tracking system, stand and solar collector 1102 are arranged to pivot the solar collector at least 170 degrees, or at least 160 degrees, or at least 150 degrees, while keeping the pivot axis 1206 substantially at the center of gravity of the collector. Some implementations involve a pivot range of at least 120 or 140 degrees. The pivot range can be increased by pushing the pivot axis 1206 further from the center of gravity. The pivot range may be adjusted to be lower or higher, depending on the solar insulation characteristics of a particular solar power plant site.

Figure 13A:
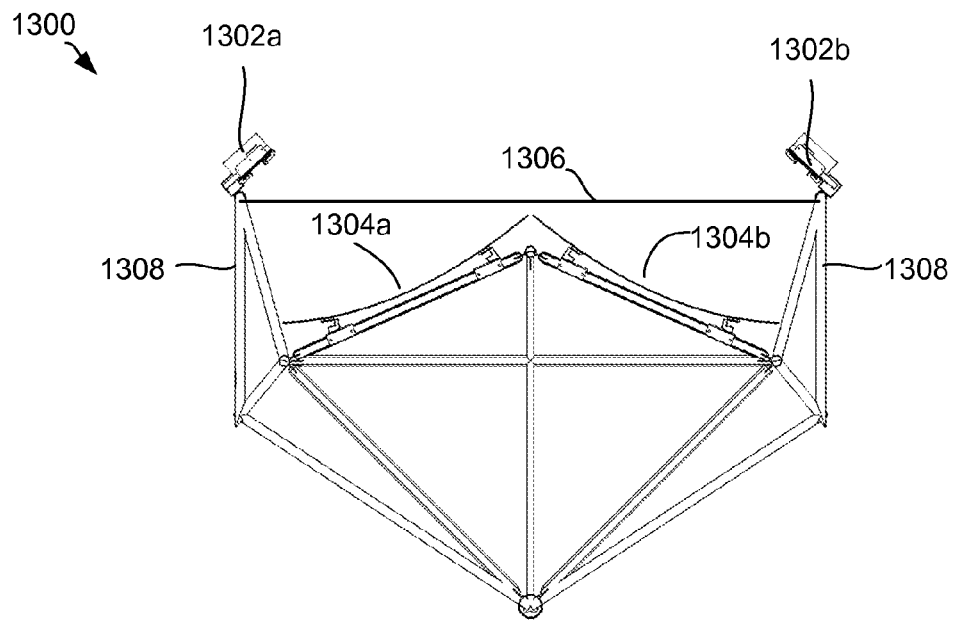
FIGS. 13A and 13B are diagrammatic cross-sectional and perspective views of a solar collector with a support cable in accordance with a particular embodiment of the present invention.
Figure 13B:
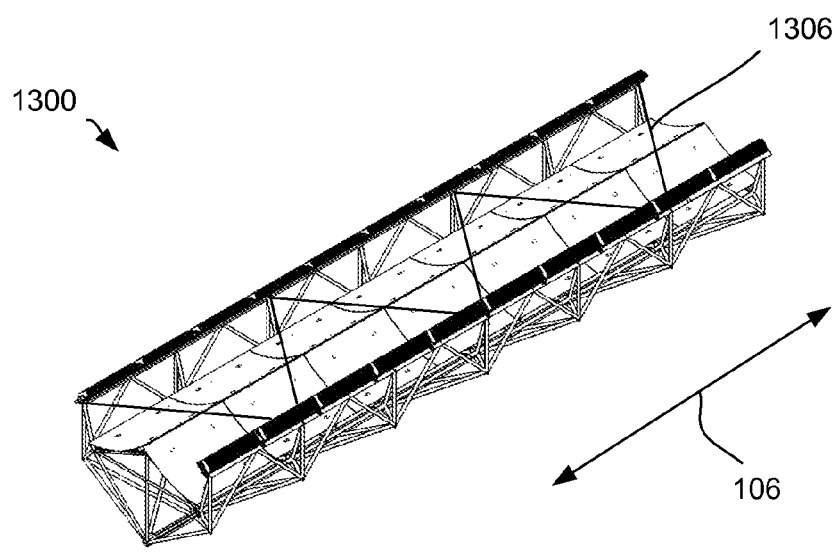

Referring next to FIGS. 13A-13B, a solar collector 1300 with a support cable 1306 according to a particular embodiment of the present invention will be described. FIG. 13A is a diagrammatic cross-sectional view of the solar collector 1300, which may be understood as the A-type collector 500 illustrated in FIG. 5A. A support cable 1306 extends across the span of the collector 1300 to couple together the solar receivers 1302a/1302b and/or the receiver support struts 1308 on either side of the collector. FIG. 13B is a diagrammatic perspective view of the solar collector illustrated in FIG. 13A.

The support cable 1306 is arranged to provide additional support for the solar receivers 1302a/1302b and their associated support structures. Preferably, the support cable 1306 has a small diameter so that it only minimally shades the underlying reflector panels 1304a/1304b. For example, a diameter of less than approximately 3 mm works well for various applications. Moreover, the effect of any shading by the cable 1306 on the reflector panel can be further reduced if the reflective panel has a convex curvature. That is, even when portions of the reflective panel are rendered unable to reflect light, there may be few or no breaks in the flux line formed by the reflective panel, for the reasons previously discussed in connection with FIGS. 2A-2C.

The support cable 1306 may be made of any suitably resilient material, such as a metal wire. It may be attached directly to opposing solar receivers 1302a/1302b, to a portion of the support structure for the solar receivers, are some other suitable portion of the collector 1300. Various embodiments of the present invention involves a support cable 1306 that extends diagonally multiple times across the span of the collector (e.g., as seen in FIG. 13B), rather than directly across (e.g., in a direction that is perpendicular to the longitudinal axis 106 of the collector.)

Although only a few embodiments of the invention have been described in detail, it should be appreciated that the invention may be implemented in many other forms without departing from the spirit or scope of the invention. In the foregoing description, components in one figure can be modified or replaced based on corresponding elements in another figure. For example, the features of the reflector panel 1000 illustrated FIG. 10 may be included in any figure that references a reflector panel, including but not limited to FIGS. 1A, 2A-2C and 3A-3D. It should also be noted that the axes may be understood as having a consistent meaning across all the figures. That is, the x, y, and z axes are perpendicular to one another. Additionally, it should be noted that the axes may be used to understand the design of various embodiments that are based on more than one figure. For example, FIG. 2B illustrates a line of convex shaped reflector panels that extend along a longitudinal axis. FIG. 1B illustrates a relatively zoomed out view of a collector in which the panels are illustrated in less detail. Therefore, the present invention also contemplates a particular embodiment where the features of the reflector panels of FIG. 2B are included in the reflector panels of FIG. 1A. In understanding this embodiment, the longitudinal axes 106 of FIGS. 1A and 2B may be used as a common reference point to understand how the reflector panels of FIG. 2B are used in the collector of FIG. 1A. Additionally, the specification and claims sometimes refer to "the normal operation of the solar collector." This generally refers to a mode in which the collector is tracking the movement of the sun (e.g., as shown in FIG. 12). However, it should be appreciated that the collector does not necessarily always track the sun during normal operation. For example, in some implementations the collector does not track the sun in the early morning. Therefore, the present embodiments should be considered as illustrative and not restrictive and the invention is not limited to the details given herein, but may be modified within the scope and equivalents of the appended claims.

What is claimed is:

1. A photovoltaic solar energy collector suitable for use in a solar energy collection system that includes the collector, a stand that supports the collector and a tracking system that causes the collector to track movements of the sun along at least one axis, the collector comprising:

at least one reflector panel that extends in a longitudinal direction;

at least one solar receiver, each solar receiver including at least one photovoltaic cell, the at least one reflector panel being arranged to direct incident sunlight to the at least one solar receiver; and a space frame support structure that physically supports the at least one reflector panel and the at least one solar receiver, the space frame support structure including a multiplicity of linear struts that are connected at nodes to form a multiplicity of triangular structures; including a first triangular structure and a second triangular structure wherein:

the first triangular structure is arranged to help physically support the at least one solar receiver and includes first, second and third vertices, the first vertex of the first triangular structure being adjacent to and underlying the at least one solar receiver; and the second triangular structure is arranged to help physically support the at least one reflector panel and includes first, second and third vertices, the first vertex of the second triangular structure being positioned at the periphery of the collector wherein the second vertex of the second triangular structure is the second vertex of the first triangular structure.

2. A solar collector as recited in claim 1, further comprising:

a longeron that extends in said longitudinal direction, the at least one solar receiver being attached with the longeron;

the nodes of the space frame support structure include a plurality of nodes that are separated by gaps and that are arranged along the length of the longeron; and a plurality of the struts are coupled to each of the nodes on the longeron and extend diagonally downward from the node to help support the at least one solar receiver.

3. A solar collector as recited in claim 1, wherein:

the at least one reflector panel includes a first reflector panel and a second reflector panel, the first and second reflector panels each including an inner edge and an outer edge that extend in a longitudinal direction, the inner edges of the first and second reflector panels being positioned closer to one another than the outer edges of the first and second reflector panels, the first and second reflector panels being arranged such that the outer edges of the first and second reflector panels are positioned higher than the inner edges of the first and second reflector panels; and the first and second solar receivers are positioned adjacent to one another over a region that is between the inner edges of the first and second reflector panels, respectively.

4. A solar collector as recited in claim 3, wherein:

the collector further comprises a upper longeron, the multiplicity of struts including at least two receiver support struts that help physically support the at least one solar receiver, the upper longeron being positioned higher than the first and second reflector panels and extending in said longitudinal direction, the first and second solar receivers being mounted on the upper longeron;

the nodes of the space frame support structure includes a plurality of top nodes that are separated by gaps and that are arranged along the length of the upper longeron, the top nodes being positioned higher than the first and second reflector panels; and the at least two receiver support struts are attached to the top node on the upper longeron and extend diagonally downward therefrom to pass between the first and second reflector panels to help support the first and second solar receivers.

5. A solar collector as recited in claim 3, wherein:

the second solar receiver is positioned over and shades the first solar receiver; and the second reflector panel is positioned higher than the first reflector panel.

6. A solar collector as recited in claim 3, wherein:

the at least one reflector panel further includes a third reflector panel and a fourth reflector panel, each reflector panel having a backside and a reflective frontside, the third reflector panel being positioned outside the outer edge of the first reflector panel, the fourth reflector panel being positioned outside the outer edge of the second reflector panel, each reflector panel having a concave shape that curves outward from a central region between the first and second reflector panels; and the at least one solar receiver further includes a third solar receiver and a fourth solar receiver, the third and fourth solar receivers being positioned on the backsides of and at the outer edges of the first and second reflector panels, respectively, wherein the reflective frontsides of the third and fourth reflector panels are arranged to direct incident light to the third and fourth solar receivers, respectively.

7. A solar energy collector as recited in claim 1, wherein:

the nodes of the space frame support structure includes a central node;

the multiplicity of struts includes at least one reflector support strut that physically helps to support the at least one reflector panel;

the collector further comprises an upper longeron, a lower longeron and a side longeron that all extend substantially parallel to one another in a longitudinal direction, the upper longeron being positioned higher than the lower longeron, the at least one solar receiver being positioned on the upper longeron; and the at least one reflector support strut includes a first reflector support strut and a second reflector support strut, the first reflector support strut extending from the central node in the space frame support structure to the side longeron, the second reflector support strut extending from the lower longeron to the side longeron, wherein the first and second reflector support struts are arranged to help physically support the at least one reflector.

8. A solar energy collector as recited in claim 1, wherein:

each node in the space frame support structure includes a connector for connecting a plurality of the struts, the connector comprising a base structure and at least one fin that extends out of the base structure, each fin having at least one alignment hole; and a plurality of the struts each have a slot at one end and a plurality of alignment holes, wherein the engagement feature is arranged to fit within the slot at the end of the strut and to be secured to the fin with a fastener that slides through the alignment holes of the strut and the fin.

9. A solar collector as recited in claim 1, wherein the longitudinal period of the repeating geometric pattern does not equal the longitudinal length of either a receiver or reflector panel.

10. A photovoltaic solar energy collection system, comprising:

a solar collector as recited in claim 1;

a stand that pivotally supports the collector for pivotal movement around a pivot axis, wherein the pivot axis passes substantially through the center of gravity of the collector; and a tracking system that causes the collector to pivot around the pivot axis to track movements of the sun along at least one axis.

11. A solar energy collection system as recited in claim 10, wherein the range of motion around the pivot axis is one selected from a group consisting of: 1) at least 150 degrees; 2) at least 160 degrees; and 3) at least 170 degrees.

12. A solar energy collection system as recited in claim 1, wherein each strut is formed from one selected from a group consisting of roll formed steel sections, hot rolled steel sections, and tubular aluminum extruded members.

13. A solar energy collection system as recited in claim 1, wherein:
the collector further comprises an upper longeron that extends along the longitudinal axis and a connector, the connector being an integrally formed metal piece that encircles and is secured to the upper longeron, the connector having engagement features for receiving the at least two receiver support struts;
the multiplicity of struts includes at least two receiver support struts, the at least two receiver support struts being arranged to physically help support the at least one solar receiver, the at least two receivers support struts being secured to the connector on the longeron and extending diagonally downward from the upper longeron at least partially in a direction that is perpendicular to the longitudinal axis, thereby helping to physically support the upper longeron and the first and second solar receivers;
the solar collector is substantially symmetrical along a bisecting plane; and
the upper longeron and the attached connector are positioned on the bisecting plane, are adjacent to and underlie a region that is between the first and second solar receivers.

14. A photovoltaic solar energy collector suitable for use in a solar energy collection system that includes the collector, a stand that supports the collector and a tracking system that causes the collector to track movements of the sun along at least one axis, the collector comprising:
at least one reflector panel that extends in a longitudinal direction;
at least one solar receiver, each solar receiver including at least one photovoltaic cell, the at least one reflector panel being arranged to direct incident sunlight to the at least one solar receiver; and
a space frame support structure that physically supports the at least one reflector panel and the at least one solar receiver, the space frame support structure including a plurality of longerons and a multiplicity of linear struts that are connected at nodes to form a repeating geometric pattern, the space frame support structure being unitary such that both receiver and reflector loads are distributed through the space frame support structure, wherein there is a connector at least some of the nodes, each connector comprising:
a hollow, open-ended body that is arranged to engage and encircle one of the longerons; and
a plurality of fins that extend out of the body, each fin including at least one alignment hole, wherein the ends of at least some of the struts include a slot, each fin being arranged to be inserted into the slot to help secure the fin to the strut.

15. A photovoltaic solar energy collector as recited in claim 1 wherein the collector supports adjustable attachment points for attaching the at least one reflector panel such that different numbers of reflector panels and reflector panels of different sizes can be mounted on the space frame support structure.

16. A photovoltaic solar energy collector as recited in claim 1 wherein:
the at least one reflector panel has a concave shape;
the multiplicity of linear struts includes a plurality of reflector support struts that underlie, are adjacent to and physically support the at least one reflector panel wherein the plurality of reflector support struts are straight and do not match the concave shape of the reflector panel.

17. A photovoltaic solar energy collector as recited in claim 1 wherein each of the multiplicity of triangular structures are formed from at least three of the linear struts and wherein the at least three of the linear struts define and border an aperture in a central region of the triangular structure that allows air to pass therethrough.

18. A photovoltaic solar energy collector as recited in claim 1 wherein:
there is a gap between the first and second reflector panels;
a plurality of the linear struts, which form at least part of the first triangular structure, extend through the gap between the first and second reflector panels and meet at a top node, which forms the first vertex of the first triangular structure;
there is an aperture between the plurality of linear struts of the first triangular structure that allows air to pass therethrough; and
the top node is situated higher than the first and second reflector panels and is adjacent to the first and second solar receivers.

19. A photovoltaic solar energy collector as recited in claim 1 wherein the third vertex of the first triangular structure is the third vertex of the second triangular structure.

20. A photovoltaic solar energy collector as recited in claim 14 wherein at least one of the plurality of fins includes a plurality of alignment holes and is thereby arranged to be secured with a corresponding plurality of the struts.

* * * * *